United States Patent
Comisky et al.

(10) Patent No.: US 7,630,841 B2
(45) Date of Patent: Dec. 8, 2009

(54) SUPERVISING AND SEQUENCING COMMONLY DRIVEN POWER SUPPLIES WITH DIGITAL INFORMATION

(75) Inventors: David Allan Comisky, St. Charles, IL (US); Brandon Christopher Azbell, Carol Stream, IL (US); Bradley James Griffis, Schaumburg, IL (US)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 11/731,040

(22) Filed: Mar. 30, 2007

(65) Prior Publication Data
US 2008/0238488 A1    Oct. 2, 2008

(51) Int. Cl.
*G01R 21/06*    (2006.01)
(52) U.S. Cl. ........................................ 702/60
(58) Field of Classification Search .............. 702/60, 702/58, 61, 64, 65, 126; 324/76.11, 500
See application file for complete search history.

(56) References Cited

U.S. PATENT DOCUMENTS

| | | | | |
|---|---|---|---|---|
| 5,488,531 A | * | 1/1996 | Aldridge et al. | 361/18 |
| 5,572,735 A | * | 11/1996 | Tanikawa | 713/300 |
| 5,682,111 A | * | 10/1997 | Bacrania et al. | 327/143 |
| 6,199,168 B1 | * | 3/2001 | Miller | 713/300 |
| 6,268,711 B1 | * | 7/2001 | Bearfield | 320/117 |
| 6,396,169 B1 | * | 5/2002 | Voegeli et al. | 307/52 |
| 6,448,672 B1 | * | 9/2002 | Voegeli et al. | 307/52 |
| 6,651,178 B1 | * | 11/2003 | Voegeli et al. | 713/300 |
| 2007/0043963 A1 | * | 2/2007 | Cheng et al. | 713/320 |
| 2008/0028237 A1 | * | 1/2008 | Knight | 713/300 |

* cited by examiner

*Primary Examiner*—Michael P. Nghiem
*Assistant Examiner*—Cindy H Khuu
(74) *Attorney, Agent, or Firm*—Steven A. Shaw; W. James Brady; Frederick J. Telecky, Jr.

(57) ABSTRACT

Methods and apparatus for power monitoring with sequencing and supervision are disclosed. An example method disclosed herein includes supervising a first power rail and a second power rail, sequencing a first enable signal associated with the first power rail and a second enable signal associated with the second power rail, and determining whether the first power rail is enabled based on regulation information determined while supervising the first power rail.

11 Claims, 12 Drawing Sheets

SUPERVISING AND SEQUENCING COMMONLY DRIVEN POWER SUPPLIES WITH DIGITAL INFORMATION

FIELD OF THE DISCLOSURE

This disclosure relates generally to power monitoring and, more particularly, to methods and apparatus for power monitoring with sequencing and supervision.

BACKGROUND

Many modern electronic systems include multiple power rails for powering the system's constituent components and subsystems. The multiple power rails may be configured to provide component and/or subsystem isolation, different supply voltages for different components and/or subsystems, etc. Power supply supervision in such an electronic system may involve monitoring each of the power rails to determine whether they are operating within desired voltage ranges (i.e., in-regulation). Furthermore, power supply sequencing may be required in such an electronic system to ensure that the power supplies corresponding to the various power rails are enabled in a proper order. In many existing electronic systems having multiple power rails, power supply supervision and power supply sequencing are treated as separate design considerations and, thus, implemented as separate system functions.

DETAILED DESCRIPTION

Figure 1:
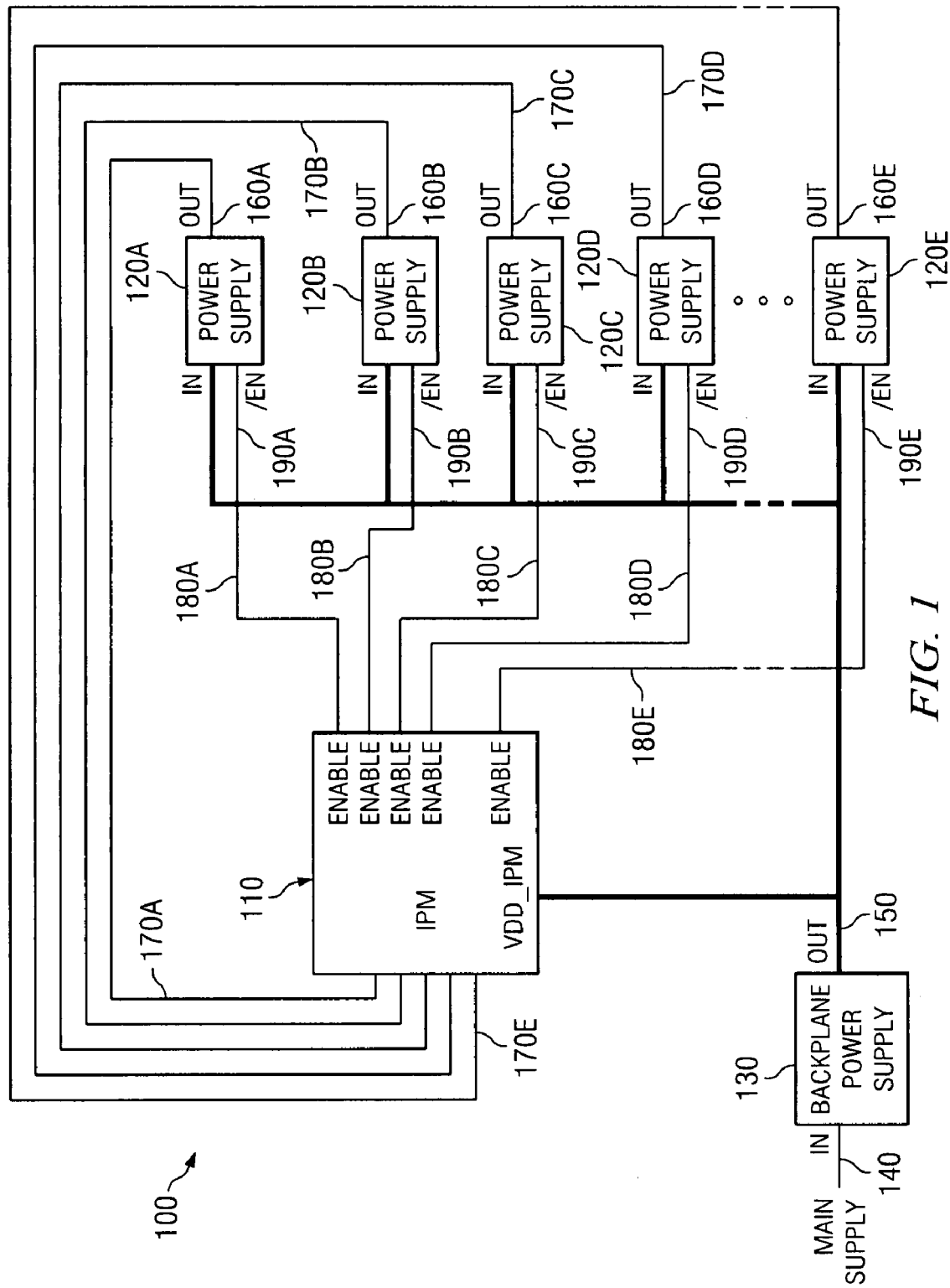
FIG. 1 is a block diagram of an example system monitored by an example power monitor.

A block diagram of an example system 100 that includes an example power monitor 110 capable of employing the methods and/or apparatus disclosed herein to monitor a set of power supplies 120A-120E is shown in FIG. 1. The example system 100 includes a common or backplane power supply 130 to, for example, regulate and/or condition a main supply voltage used to drive the system 100. For example, the backplane power supply 130 may regulate and/or condition a main supply voltage applied to a main supply input 140. The resulting regulated and/or conditioned voltage is then provided by the backplane power supply 130 at a backplane power supply output 150. The voltage provided by the backplane power supply output 150 drives the example power monitor 110 and the set of power supplies 120A-120E included in the example system 100, as illustrated in FIG. 1.

The set of power supplies 120A-120E included in the example system 100 may, in turn, drive circuitry attached to each of the respective power rails 160A-160E. For example, similar to the backplane power supply 130, the power supplies 120A-120E may regulate and/or condition the voltage provided at the backplane power supply output 150. In some implementations of the example system 100, some or all of the power supplies 120A-120E are used to isolate various circuit components from each other to provide, for example, circuit protection, efficiency of system power-up and power-down, etc. Furthermore, in some implementations, some or all of the power supplies 120A-120E are used to provide different voltage sources for driving circuit components that operate at different voltage levels than the output voltage provided by the backplane power supply 150. Additionally, in some implementations, some or all of the power supplies 120A-120E may have sequencing interdependencies such that the one or more of the power supplies 120A-120E must be enabled and/or disabled in a proper order. For example, the power supply 120A could drive circuitry that must be operational before circuitry driven by power supply 120B may be activated. In such a scenario, enabling of the power supply 120A would need to be sequenced in advance of enabling the power supply 120B.

To determine whether the set of power supplies 120A-120E is operating properly, the example power monitor 110 monitors the power rails 160A-160E, respectively, of the power supplies 120A-120E. As such, the example power monitor 110 includes a set of rail inputs 170A-170E configured to couple with and sample the respective power rails 160A-160E as shown. In particular, the example power monitor 110 supervises the power rails 160A-160E via the respective rail inputs 170A-170E to determine whether the power rails 160A-160E are in-regulation. For example, a particular power rail 160A-160E may be considered in-regulation when its monitored voltage lies within a specified voltage range. In an example implementation, the example power monitor 110 is configured to determine whether each power rail 160A-160E has a voltage lying within a voltage range between an over-voltage threshold and an under-voltage threshold. If the voltage for a particular power rail 160A-160E exceeds the over-voltage threshold or is below the under-voltage threshold, the rail is deemed out-of-regulation. The over-voltage thresholds and the under-voltage thresholds used to monitor the power rails 160A-160E may be common to all rails, specified for each rail, specified for two or more groups of rails, etc.

Furthermore, when one or more of the power rails 160A-160E are deemed to be out-of-regulation, the example power monitor 110 may disable the corresponding one or more power supplies 120A-120E to protect any associated circuitry from damage, erroneous operation, etc. Additionally, the example power monitor 110 may disable any other power supplies 120A-120E that are specified as being dependent on the one or more out-of-regulation power supplies 120A-120E. To disable the power supplies 120A-120E, the example power monitor 110 includes a set of respective enable outputs 180A-180E. The enable outputs 180A-180E are configured to couple with respective enable inputs 190A-190E included in the corresponding power supplies 120A-120E as shown. For example, to disable a particular power supply 120A-120E, the example power monitor 110 may clear the corresponding enable output 180A-180E associated with the particular power supply to be disabled.

In addition to its supervising role, the example power monitor 110 also sequences the enabling of the power rails 160A-160E via the respective enable outputs 180A-180E. Sequencing involves enabling the power supplies 120A-120E corresponding to the power rails 160A-160E in a particular order. To enable a particular power supply 120A-120E, the example power monitor 110 may assert the corresponding enable output 180A-180E associated with the particular power supply to be enabled. For example, the particular order for sequencing the power rails 160A-160E may be based on any or all of: (1) specified elapsed times for enabling one or more of the power supplies 120A-120E, (2) requiring one or more of the power rails 160A-160E to be in-regulation before enabling a specified one or more of the power supplies 120A-120E, (3) requiring one or more of the power rails 160A-160E to reach a particular voltage before enabling a specified one or more of the power supplies 120A-120E, etc.

Figure 2:
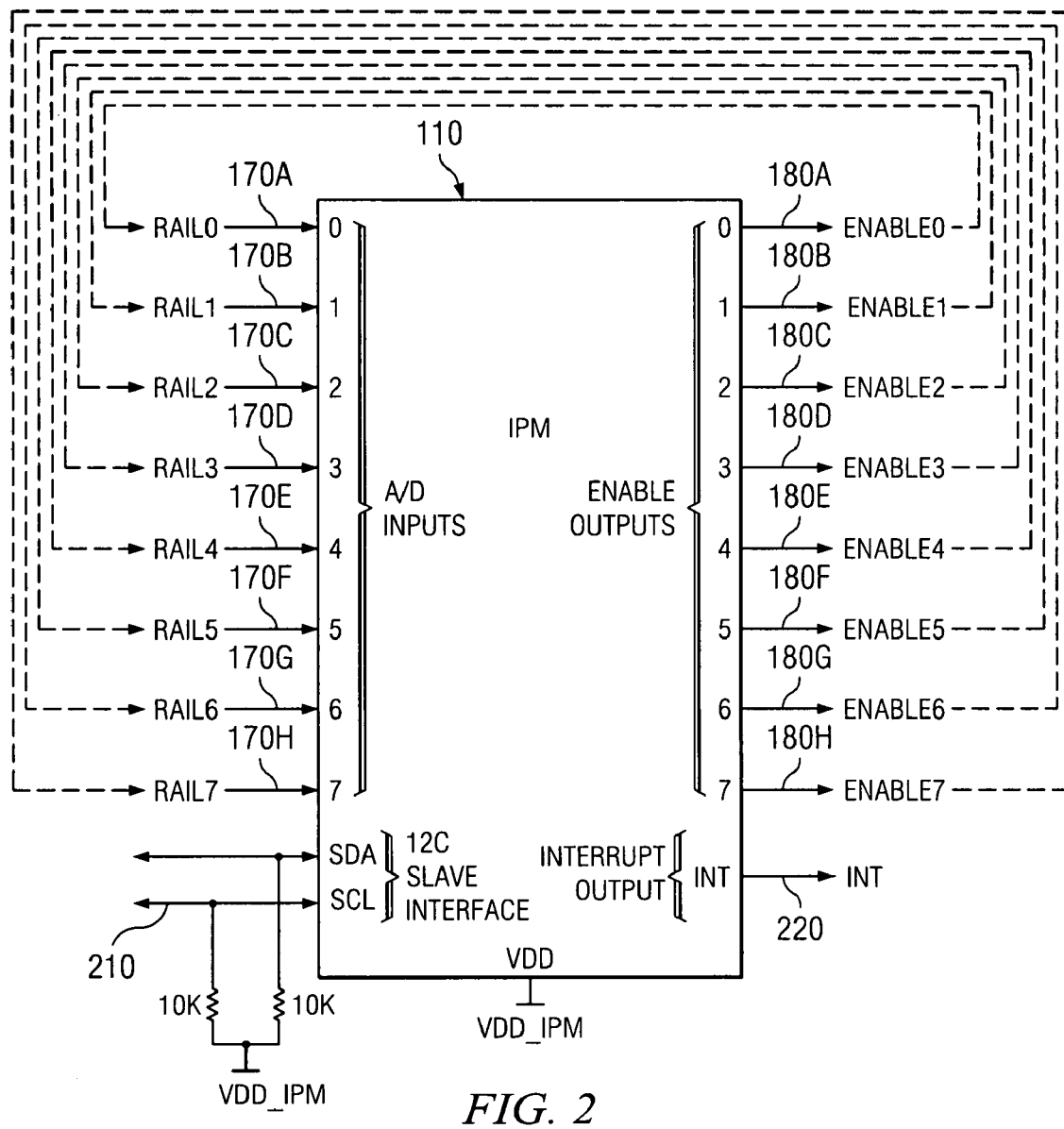
FIG. 2 is a schematic illustration of an example power monitor that may be used in the example system of FIG. 1.

A more detailed schematic illustration of the example power monitor 110 is shown in FIG. 2. The example power monitor 110 illustrated in FIG. 2 includes a set of rail inputs 170A-170H, discussed above in connection with FIG. 1, to monitor a set of power rails (e.g., such as the power rails 160A-160E of FIG. 1). For example, the power monitor 110 may be configured to monitor the voltages supplied by the power rails coupled to the set of rail inputs 170A-170H. Additionally or alternatively, the example power monitor 110 may be configured to monitor the currents (e.g., converted to voltages) supplied by the power rails coupled to the set of rail inputs 170A-170H. Furthermore, in some implementations, the rail inputs 170A-170H will be configured to accept a nominal input voltage range between a specified minimum voltage and a specified maximum voltage. External resistor dividers or any other voltage limiting circuitry may be included in front of any or all of the rail inputs 170A-170H to support power rails having voltages outside the nominal input voltage range.

The example power monitor 110 illustrated in FIG. 2 also includes a set of enable outputs 180A-180H, discussed above in connection with FIG. 1, to enable and/or disable a set of power supplies (e.g., such as the set of power supplies 120A-120E of FIG. 1) corresponding to the power rails (e.g., such as the power rails 160A-160E) monitored by the respective rail inputs 170A-170H. An example relationship between the power supply controlled by a particular one of the enable outputs 180A-180H and the corresponding power rail monitored by the respective one of the rail inputs 170A-170H is depicted as a dotted line in FIG. 2. Other arrangements are, of course, possible. As discussed above in connection with FIG. 1, the example power monitor 110 uses the enable outputs 180A-180H to sequence the enabling of power supplies and/or to disable power supplies that are deemed to be out-of-regulation. For example, some or all of the outputs 180A-180H may be configured to enable power supplies by asserting a positive (or negative) voltage signal and to disable power supplies by setting (or clearing) their output voltage(s) to zero. Additionally or alternatively, some or all of the outputs 180A-180H may be configured to enable power supplies by setting (or clearing) their output voltage(s) to zero and/or to disable power supplies by asserting a positive (or negative) voltage signal. The precise signaling protocol selected is application dependent.

The example power monitor 110 illustrated in FIG. 2 further includes a communication port 210 and an interrupt output 220. In the example of FIG. 2, the communication port 210 is implemented as a serial communication port 210, such as, for example, an Inter-IC (I2C) serial interface. However, the communication port 210 may be implemented as any type of serial interface, such as a serial peripheral interface (SPI), a universal asynchronous receiver/transceiver (UART), etc., and/or as any type of parallel interface, etc. The communication port 210 may be configured to interface with, for example, a central controller, a system backplane, etc. As such, the example power monitor 110 may use the communication port 210 to report information, such as, for example, the monitored voltages and/or current levels at the rail inputs 170A-170H, any error conditions (e.g., such as out-of-regulation, over-voltage, under-voltage, etc.), sequencing status (e.g., such as rail powered down, rail sequencing in progress, rail sequencing failed, etc.), etc. Additionally or alternatively, the example power monitor 110 may use the communication port 210 to receive configuration information (e.g., activation information concerning which rail inputs 170A-170H and/or enable outputs 180A-180H are active, regulations thresholds, such as, for example, over-voltage thresholds and/or under-voltage thresholds, etc.), processing upgrades, etc.

The interrupt output 220 is also configured to interface with, for example, a central controller, a system backplane, etc. The example power monitor 110 may use the interrupt output 220 to provide a notification that, for example, an alarm condition has occurred, a status quo has changed, etc. The polarity and sense of the interrupt output 220 may be configurable and dictated by the central controller, a system backplane, etc., coupled therewith. For example, the interrupt output 220 may be configured to provide positive edge, positive level, negative edge, negative level, etc., interrupts depending on the particular application.

Figure 3:
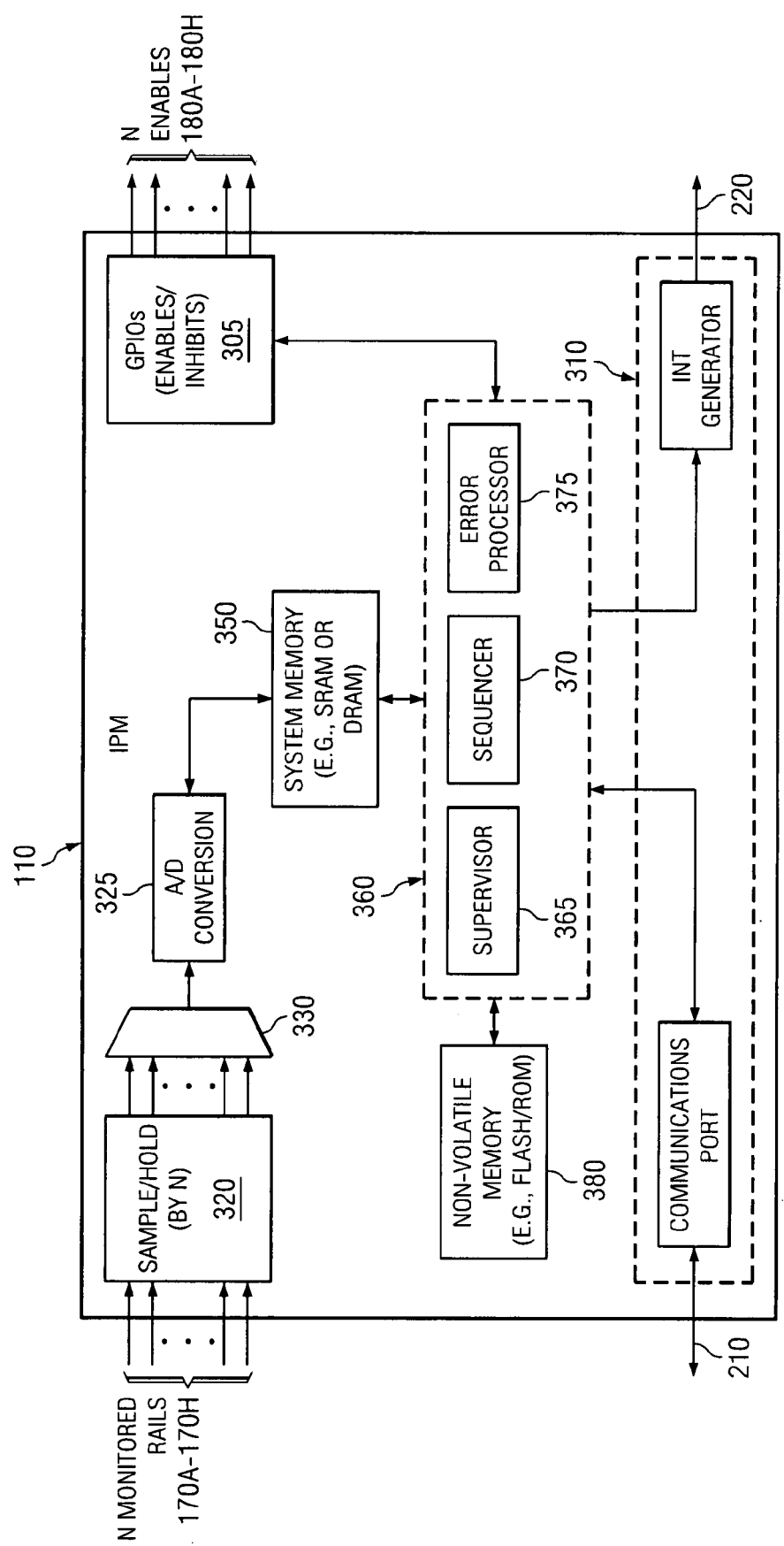
FIG. 3 is a block diagram illustrating an example implementation of the example power monitor of FIG. 2 comprising an example supervisor, an example sequencer and an example error processor.

A block diagram illustrating an example implementation of the example power monitor 110 of FIGS. 1 and 2 is shown in FIG. 3. Following the examples illustrated in FIGS. 1 and 2, the example power monitor 110 of FIG. 3 includes the set of rail inputs 170A-170H to monitor a set of power rails. Also following the examples illustrated in FIGS. 1 and 2, the example power monitor 110 of FIG. 3 includes the set of enable outputs 180A-180H to enable and/or disable a set of power supplies corresponding to the set of power rails monitored by the respective rail inputs 170A-170H. To implement the enable outputs 180A-180H, the power monitor 110 of the illustrated example includes a general purpose input/output (GPIO) unit 305. The GPIO unit 305 may configure some or all of the outputs 180A-180H to generate an enable signal by asserting a positive (or negative) voltage signal and/or to generate a disable signal by setting (or clearing) their output voltage(s) to zero. Additionally or alternatively, the GPIO unit 305 may configure some or all of the outputs 180A-180H to generate an enable signal by setting (or clearing) their output voltage(s) to zero and/or to generate a disable signal by asserting a positive (or negative) voltage signal. The example power monitor 110 of FIG. 3 further includes a communication interface 310 that implements the communication port 210 and the interrupt output 220 discussed above in connection with FIG. 2.

To process the set of rail inputs 170A-170H, the example power monitor 110 of FIG. 3 includes a sample-and-hold unit 320. The sample-and-hold unit 320 samples, for example, the voltages of the power rails (e.g., such as the power rails 160A-160E of FIG. 1) coupled to the rail inputs 170A-170H. The samples determined by the sample-and-hold unit 320 are then routed to an analog-to-digital (A/D) converter 325 through a multiplexer 330. The A/D converter 325 converts, for example, the sample voltages determined by the sample-and-hold unit 320 to digital voltage values that may be further processed by the power monitor 110 of the illustrated example. The digital values determined by the A/D converter 325 are stored in a system memory 350 for subsequent processing.

To process the digital values determined by the A/D converter 325 and to control the enable outputs 180A-180H, the power monitor 110 of the illustrated example includes a processor unit 360. The example processor unit 360 implements an example supervisor 365, an example sequencer 370 and an example error processor 375. The example supervisor 365 is configured to retrieve the digital values stored in the system memory 350 and determine whether the set of power rails coupled to the rail inputs 170A-170H are in-regulation. For example, the example supervisor 365 may determine whether the digital voltage values corresponding to a particular power rail indicate that the power rail's voltage is less than an under-voltage threshold and/or is greater than an over-voltage threshold. If the power rail's voltage is less than an under-voltage threshold, the example supervisor 365 determines that an under-voltage condition has occurred and the particular power rail is out-of-regulation. Conversely, if the power rail's voltage is greater than an over-voltage threshold, the example supervisor 365 determines that an over-voltage condition has occurred and the particular power rail is out-of-regulation. However, if the power rail's voltage is within these under-voltage and over-voltage thresholds, the example supervisor 365 determines that the particular power rail is in-regulation. Additionally, the example supervisor 365 may be configured to determine and report whether voltage glitches occur. For example, a voltage glitch occurs when the power rail's voltage is less than the under-voltage threshold or greater than the over-voltage threshold, but for an insufficient amount of time to consider the particular power rail to be out-of-regulation.

The example sequencer 370 is configured to sequence the enabling of power supplies coupled to the enable outputs 180A-180H. As discussed above in connection with FIG. 1, sequencing involves enabling the power supplies coupled to the enable outputs 180A-180H in a particular order. In the illustrated example, the order for enabling the power supplies is specified through sequencing configuration information stored in a non-volatile memory 380. The non-volatile memory 380 may be implemented via any type of non-volatile memory technology, such as, but not limited to, read-only memory (ROM), FLASH memory, etc. The sequencing information may be pre-stored in the non-volatile memory 380, downloaded (in the case of writable, non-volatile memory) via the communication port 210, etc.

For example, the sequencing configuration information may be downloaded and stored in tabular format, with a sequencing configuration entry for each one of the enable outputs 180A-180H. A sequencing configuration entry for a particular one of the enable outputs 180A-180H, such as, for example, enable output 180A, may include information specifying, for example, any or all of: (1) an elapsed time before asserting the enable output 180A, (2) one or more parent power rails coupled to the rail inputs 170B-170H that must be determined to be in-regulation before asserting the enable output 180A, (3) one or more parent power rails coupled to the rail inputs 170B-170H that must reach one or more specified respective voltages before asserting the enable output 180A, etc.

To determine whether and/or when to assert a particular one of the enable outputs 180A-180H (such as, for example, enable output 180A), the sequencer 370 of the illustrated example retrieves the sequencing configuration entry corresponding to enable output 180A from the non-volatile memory 380. If the sequencing configuration entry specifies that asserting enable output 180A is conditioned on an elapsed time, the example sequencer 370 may compare the specified elapsed time to a current system time (or to a difference between the current system time and a previously stored time representing the start of the time period which is to elapse prior to enabling the output 180A) to determine whether to assert the enable output 180A. If the sequencing configuration entry specifies that asserting enable output 180A is conditioned on another parent rail being in-regulation or reaching a specified voltage, the sequencer 370 of the illustrated example retrieves regulation information corresponding to the designated parent rail to determine the regulation status of the parent rail, the monitored voltage of the parent rail, etc. Such regulation information is determined by the example supervisor 365 during supervision of the power rails coupled to the rail inputs 170A-170H. The regulation information determined by the example supervisor 360 may be stored in, for example, the system memory 350 for retrieval by the example sequencer 370. Upon retrieving the appropriate regulation information for the parent rail of interest, the example sequencer 370 compares the regulation information to the condition specified in the sequencing information to determine whether to assert the enable output 180A.

The example error processor 375 is configured to process error condition(s) determined by the example supervisor 365 and/or the example sequencer 370. For example, the supervisor 365 of the illustrated example may generate any or all of the following error conditions corresponding to each of the rail inputs 170A-170H: an under-voltage error condition, an over-voltage error condition or a glitch error condition. An under-voltage error condition occurs for a particular one of the rail inputs 170A-170H when, for example, the voltage of the particular rail input is less than a specified under-voltage threshold for more than a threshold length of time. An over-voltage error condition occurs for a particular one of the rail inputs 170A-170H when, for example, the voltage of the particular rail input is greater than a specified over-voltage threshold for more than a threshold length of time. A glitch error condition occurs when, for example, the voltage is less than the under-voltage threshold or greater than the over-voltage threshold, but for a time less than a threshold period of time. Additionally, the sequencer 370 of the illustrated example may generate an enable failure error condition for any or all of the enable outputs 180A-180H. An enable failure error condition occurs when, for example, the example sequencer 370 determines that a power supply coupled to one of the enable outputs 180A-180H fails to enable within a specified time after the particular output is asserted.

The error processor 375 of the illustrated example is configured to log the error conditions determined by the example supervisor 365 and/or the example sequencer 370. The error processor 375 may store the error conditions in an error log stored in, for example, the system memory 350. Additionally or alternatively, the error processor 375 may report the error conditions to a central controller, backplane, etc., coupled to the example power monitor 110 via the communications interface 310. For example, when an error condition is received from the example supervisor 365 and/or the example sequencer 370, the error processor 375 of the illustrated example stores the error condition in an error log included in the system memory 350. To report the error condition, the error processor 375 of the illustrated example causes an interrupt to be generated at the interrupt output 220. When a receiving device (e.g., such as a central controller, backplane, etc.) coupled to the interrupt output 220 processes the interrupt, the example error processor 375 provides the error condition information to the receiving device via the communication port 210. Depending on the severity of the error condition, the example error processor 375 may trigger an interrupt and report the error to the receiving device immediately after receiving the error condition or after an error log stored in the system memory 350 becomes full.

Flowcharts representative of example machine readable instructions that may be executed to implement the example power monitor 110 of FIGS. 1, 2 and/or 3, and/or the example processor unit 360, the example supervisor 365, the example sequencer 370 and/or the example error processor 375 of FIG. 3 are shown in FIGS. 4, 6A-6B, 8A-8B and 9. In these examples, the machine readable instructions represented by each flowchart may comprise one or more programs for execution by: (a) a processor, such as the processor 1012 shown in the example computer 1000 discussed below in connection with FIG. 10, (b) a controller, and/or (c) any other suitable device. The one or more programs may be embodied in software stored on a tangible medium such as, for example, a flash memory, a CD-ROM, a floppy disk, a hard drive, a DVD, or a memory associated with the processor 1012, but persons of ordinary skill in the art will readily appreciate that the entire program or programs and/or portions thereof could alternatively be executed by a device other than the processor 1012 and/or embodied in firmware or dedicated hardware (e.g., implemented by an application specific integrated circuit (ASIC), a programmable logic device (PLD), a field programmable logic device (FPLD), discrete logic, etc.). For example, any or all of the example power monitor 110, the example processor unit 360, the example supervisor 365, the example sequencer 370 and/or the example error processor 375 could be implemented by any combination of software, hardware, and/or firmware. Also, some or all of the machine readable instructions represented by the flowchart of FIGS. 4, 6A-6B, 8A-8B and 9 may be implemented manually. Further, although the example machine readable instructions are described with reference to the flowcharts illustrated in FIGS. 4, 6A-6B, 8A-8B and 9, persons of ordinary skill in the art will readily appreciate that many other techniques for implementing the example methods and apparatus described herein may alternatively be used. For example, with reference to the flowcharts illustrated in FIGS. 4, 6A-6B, 8A-8B and 9, the order of execution of the blocks may be changed, and/or some of the blocks described may be changed, eliminated, combined and/or subdivided into multiple blocks.

Figure 4:
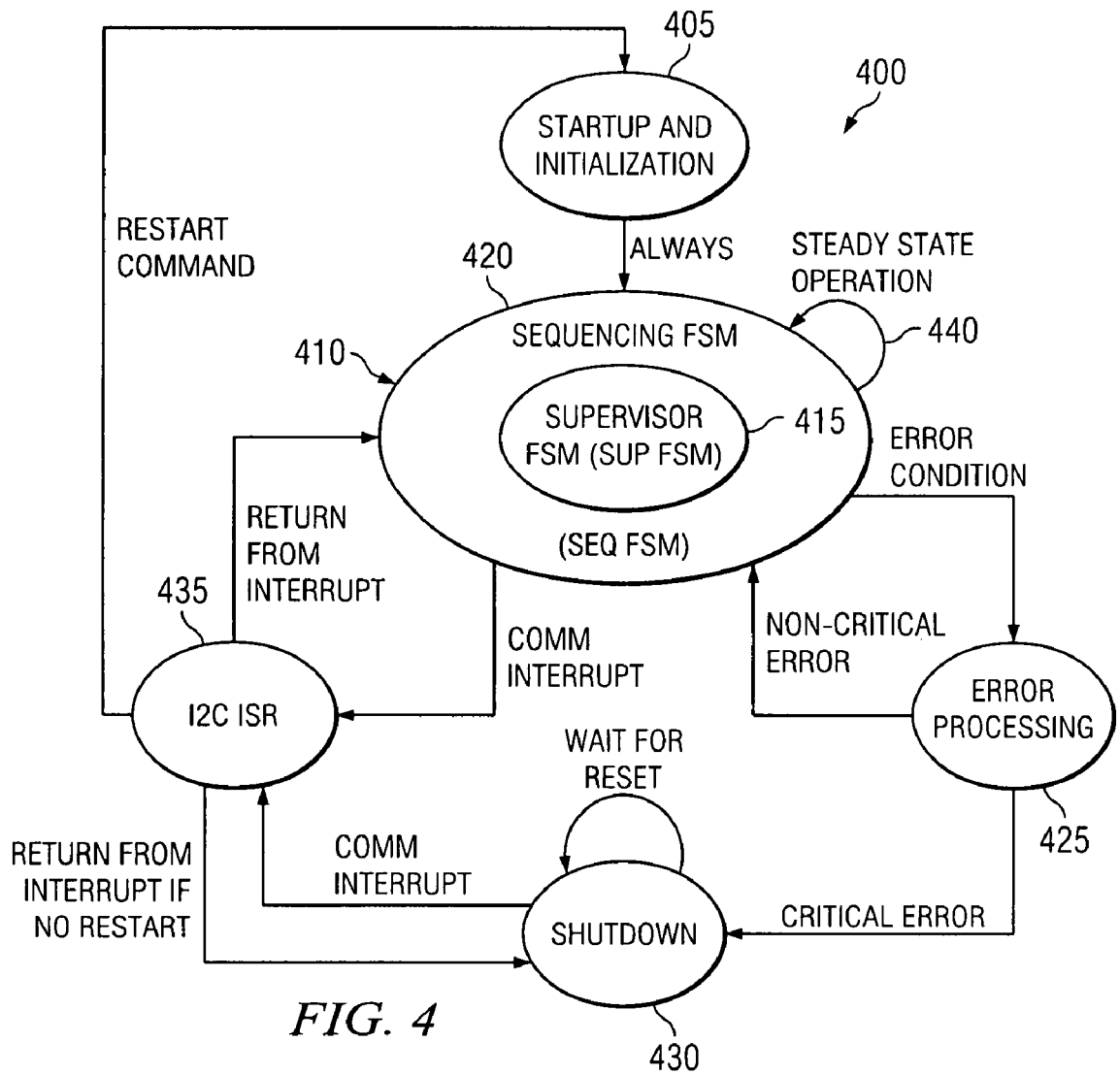
FIG. 4 is a flowchart representative of example machine readable instructions that may be executed to implement the example power monitor of FIG. 3.

Example machine readable instructions 400 that may be executed to implement the example power monitor 110 of FIGS. 1, 2 and/or 3 are shown in FIG. 4. In particular, the example machine readable instructions 400 implement a power monitoring state machine and may be executed upon, for example, the example power monitor 110 being powered-ON, reset, etc. The machine readable instructions 400 begin execution at block 405 at which the example power monitor 110 starts up, or "wakes," from a power-off (or reset) state and performs an initialization procedure. Referring to the example power monitor 110 of FIG. 3, the initialization procedure performed at block 405 includes: (1) setup and initialization of the enable outputs 180A-180H; (2) setup of the A/D converter 325 (which includes setup of the sample-and-hold unit 320 and the multiplexer 330, if appropriate); (3) setup and initialization of the interrupt output 220; (4) initialization of the communication port 210; and (5) copying of critical code/data segments to the system memory 350.

For example, at block 405 the example power monitor 110 initializes the GPIO unit 305 to place all of the enable outputs 180A-180H in a disabled, or off, state. For example, the disabled state may correspond to setting (or clearing) the output voltages of the enable outputs 180A-180H to an inactive level. Also, at block 405 the example power monitor 110 sets up the A/D converter 325. Setup of the A/D converter may include, for example, configuring an A/D reference voltage, configuring an A/D clock source, configuring an A/D sample period (e.g., such as the sample period of the sample-and-hold unit 320), configuring a DMA or other memory manager to transfer data samples determined by the A/D converter 325 to the system memory 350, etc. For example, the A/D reference voltage may be derived from an internally-generated reference source or an external source. Similarly, the A/D clock source may be derived internally from a system clock included in the example power monitor 110, or provided externally via an A/D clock input. A DMA or other memory controller may be configured to copy data samples from the A/D converter 325 to a particular memory region in the system memory 350. For example, the DMA or other memory controller may copy data samples into a circular buffer in the system memory 350, as discussed in greater detail below in connection with FIG. 7.

Initialization of the interrupt output 220 may also be performed at block 405. For example, initialization of the interrupt output 220 may involve setting the output to an inactive state. Additionally, at block 405 the example power monitor 110 may configure the polarity and sense of the interrupt output 220. For example, as discussed above in connection with FIG. 2, the interrupt output 220 may be configured to provide positive edge, positive level, negative edge, negative level, etc., interrupts depending on a particular application. Furthermore, initialization of the communication port 210 may also occur at block 405. For example, when the communication port 210 implements an I2C serial interface, initialization at block 405 may include resetting the I2C serial interface to a known state, configuring the I2C serial interface to operate in a slave mode, setting up I2C address and software variables, and setting I2C interrupt handlers.

Code/data may also be copied to system memory 350 at block 405. For example, variables in system memory 350 defining pending sequencing events, alarm conditions, etc., may be pre-loaded using initial values stored in the non-volatile memory 380. Other configuration parameters, such as, for example, under-voltage thresholds, over-voltage thresholds, etc., may be pre-loaded from initial values stored in non-volatile memory 380.

After initialization completes (block 405), control proceeds to block 410 at which the example power monitor 110 performs supervision and sequencing. During steady-state operation, the example power monitor 110 primarily executes supervision machine readable instructions 415 implementing, for example, a state machine to supervise the power rails coupled, for example, to the rail inputs 170A-170H. However, when control reaches block 410 from block 405 during startup, the example power monitor 110 also executes sequencing machine readable instructions 420 implementing, for example, a state machine to sequence the various power supplies coupled to, for example, the enable outputs 180A-180H. As discussed above, sequencing involves enabling the monitored power supplies in a particular order. In some example implementations, the sequencing machine readable instructions 420 will be executed only until all, or a specified subset, of the enable outputs 180A-180H have been asserted and their corresponding power supplies are in-regulation. In other example implementations, the sequencing machine readable instructions 420 provide negligible overhead and, therefore, will continue to be executed during steady-state operation, potentially long after all, or a specified subset, of the enable outputs 180A-180H have been asserted and their corresponding power supplies are in-regulation.

In general, the sequencing machine readable instructions 420 may require information, such as regulation information, determined by the supervision machine readable instructions 415. As such, in a typical configuration the supervision machine readable instructions 415 are responsible for scheduling execution of the sequencing machine readable instructions 420. For example, the supervision machine readable instructions 415 may schedule execution of the sequencing machine readable instructions 420 only while a sequencing event is pending for one or more power supplies. A power supply sequencing event is pending during the interval between the time at which the particular enable output 180A-180H corresponding to the power supply is asserted and the time at which the power supply reaches regulation. Thus, the supervision machine readable instructions 415 may be responsible for executing the sequencing machine readable instructions 420 prior to one or more power supplies reaching regulation. The supervision machine readable instructions 415 may then forego executing the sequencing machine readable instructions 420 once all power supplies have reached regulation and there are no power supply sequencing events pending. In some example implementations, an event pending indicator or flag may be associated with each enable output 180A-180H to signify whether the power supply coupled to each enable output 180A-180H has been enabled properly (e.g., regulation has been reached) or whether enabling is not complete and, thus, a sequencing event is still pending.

Figure 6A:
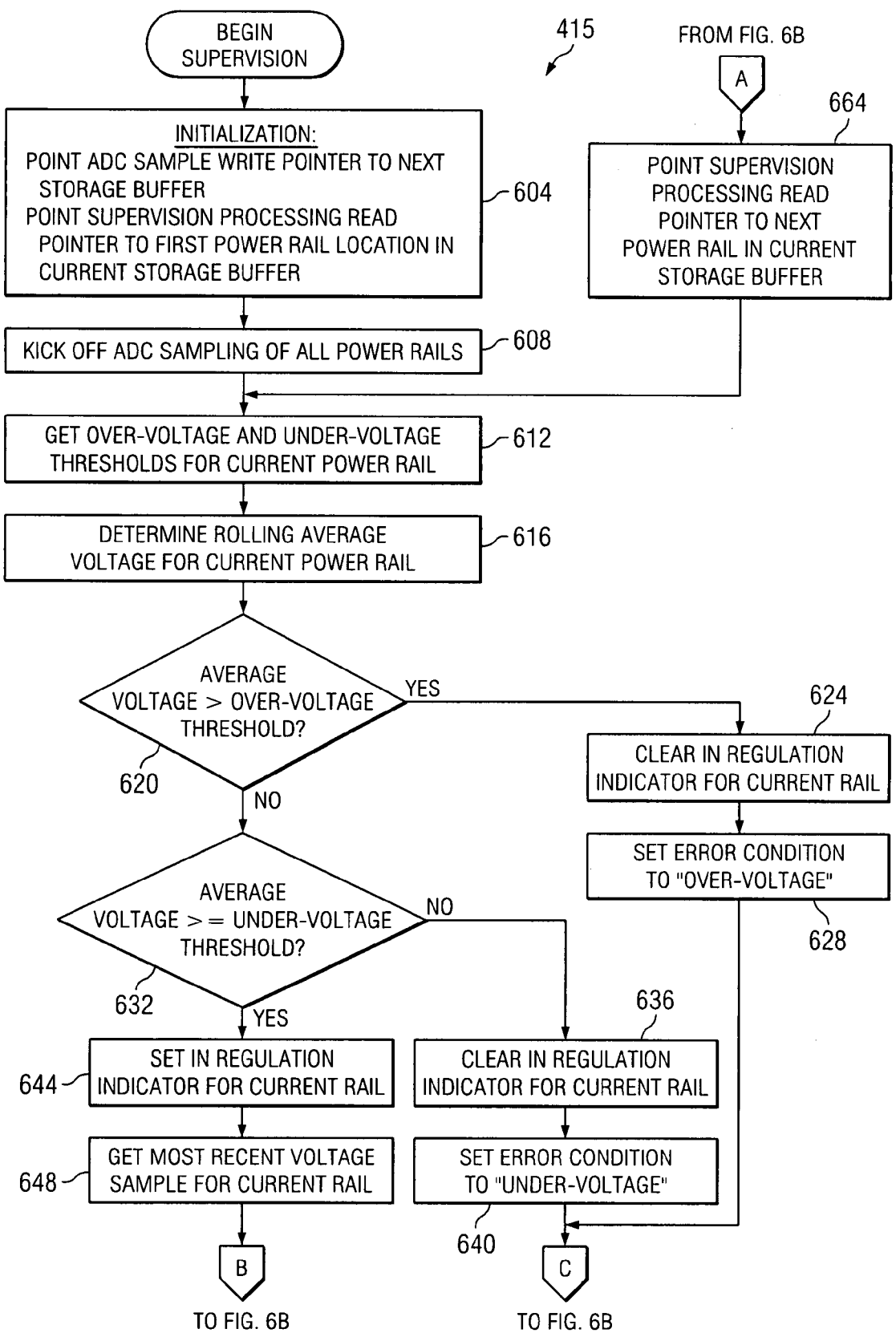
FIGS. 6A-6B collectively form a flowchart representative of example machine readable instructions that may be executed to implement an example supervisor which may be used to implement the example power monitor of FIG. 3.
Figure 6B:
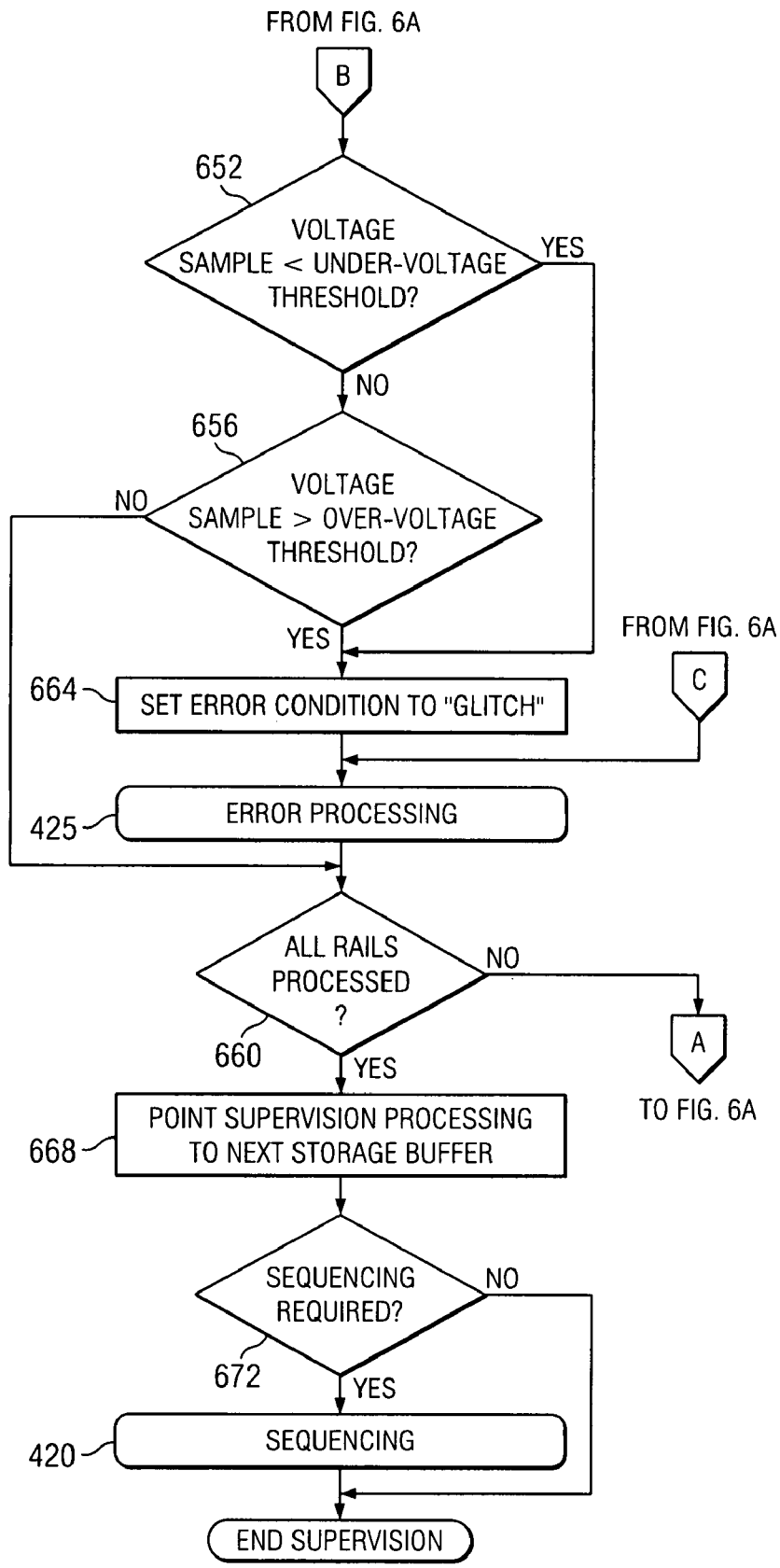
Figure 8A:
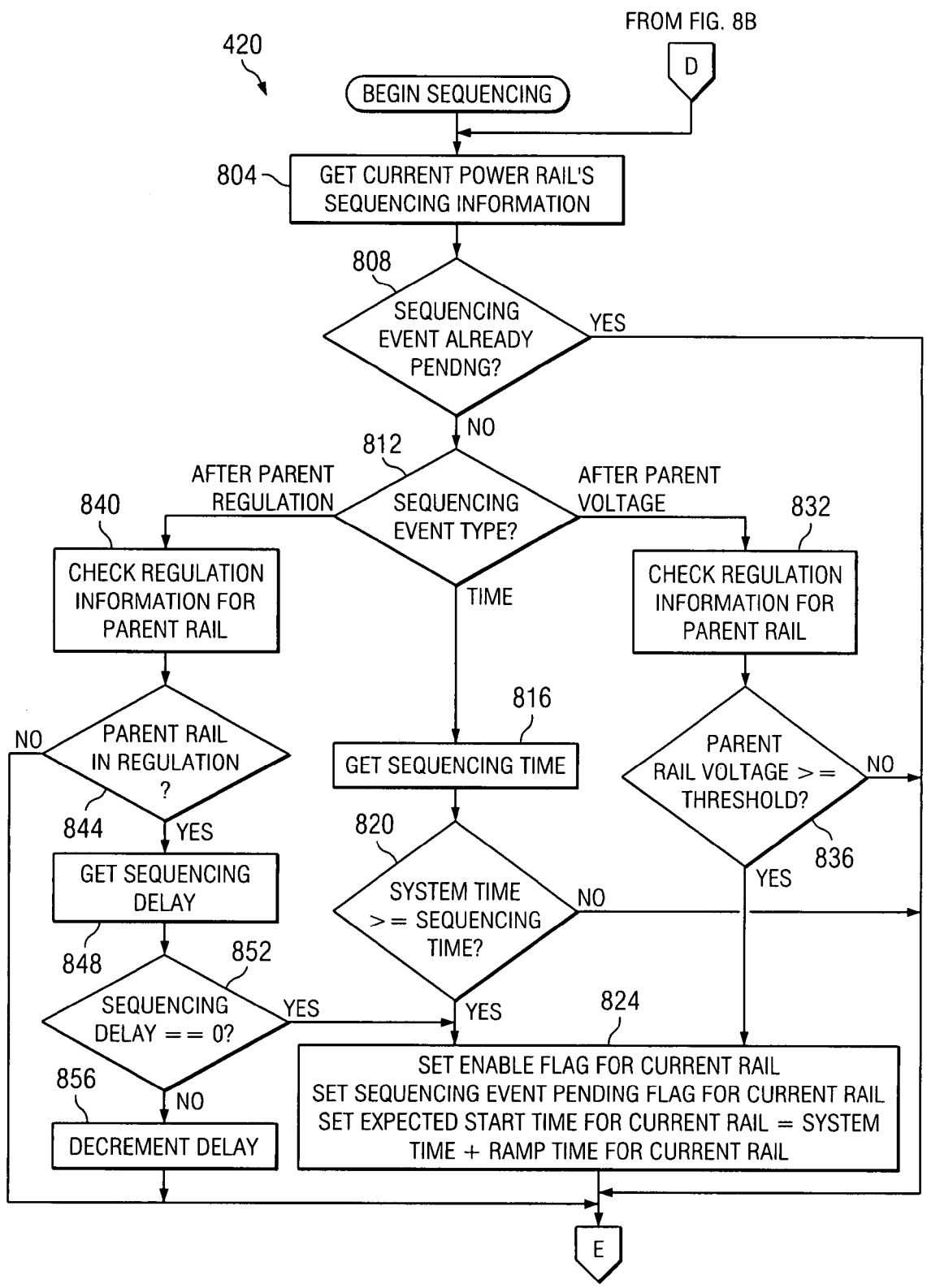
FIGS. 8A-8B collectively form a flowchart representative of example machine readable instructions that may be executed to implement an example sequencer which may be used to implement the example power monitor of FIG. 3.
Figure 8B:
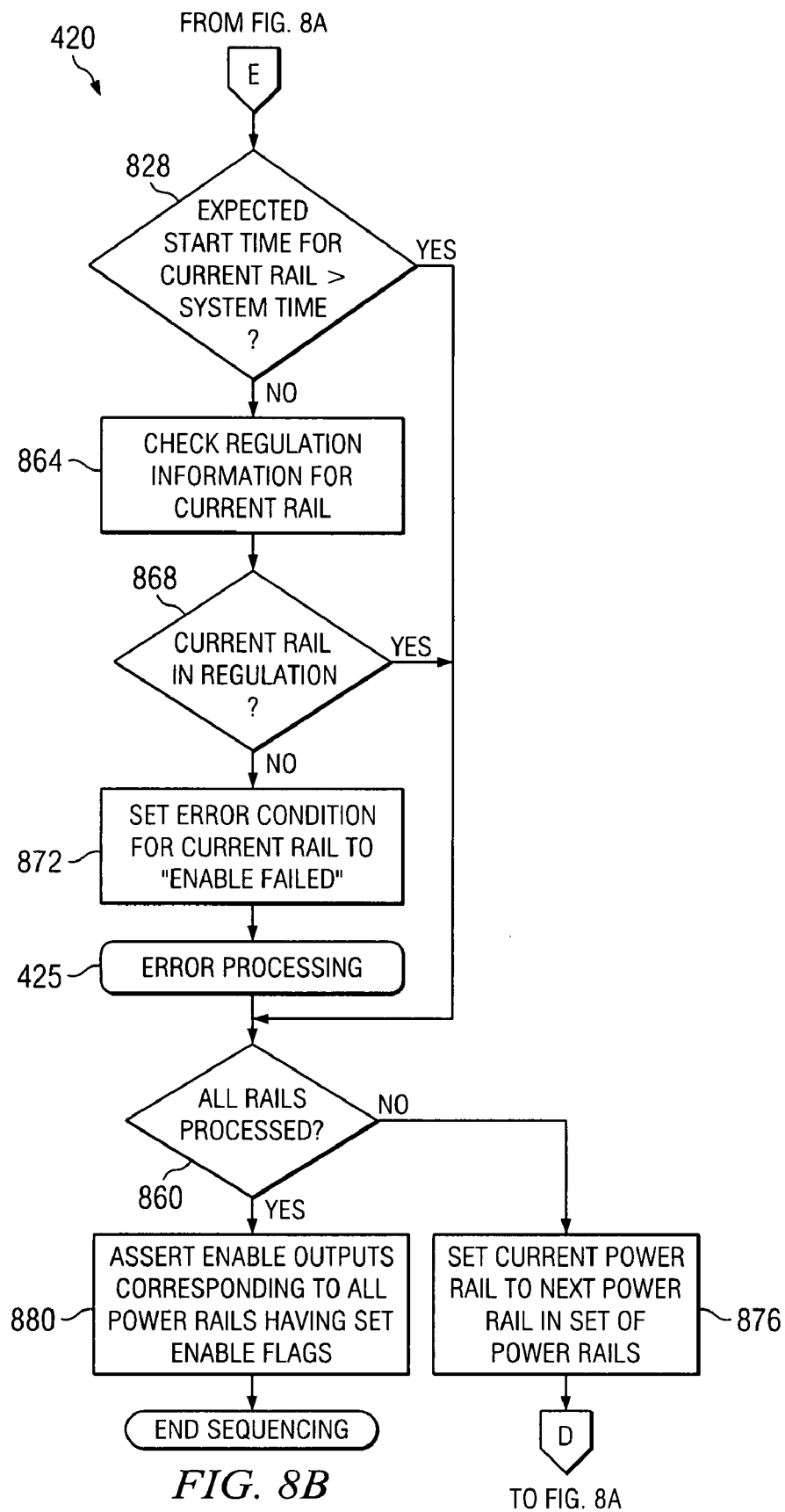

Example machine readable instructions that may be executed to implement the processing at block 415 are illustrated in FIGS. 6A-6B and discussed in greater detail below. Example machine readable instructions that may be executed to implement the processing at block 420 are illustrated in FIGS. 8A-8B and discussed in greater detail below.

Figure 9:
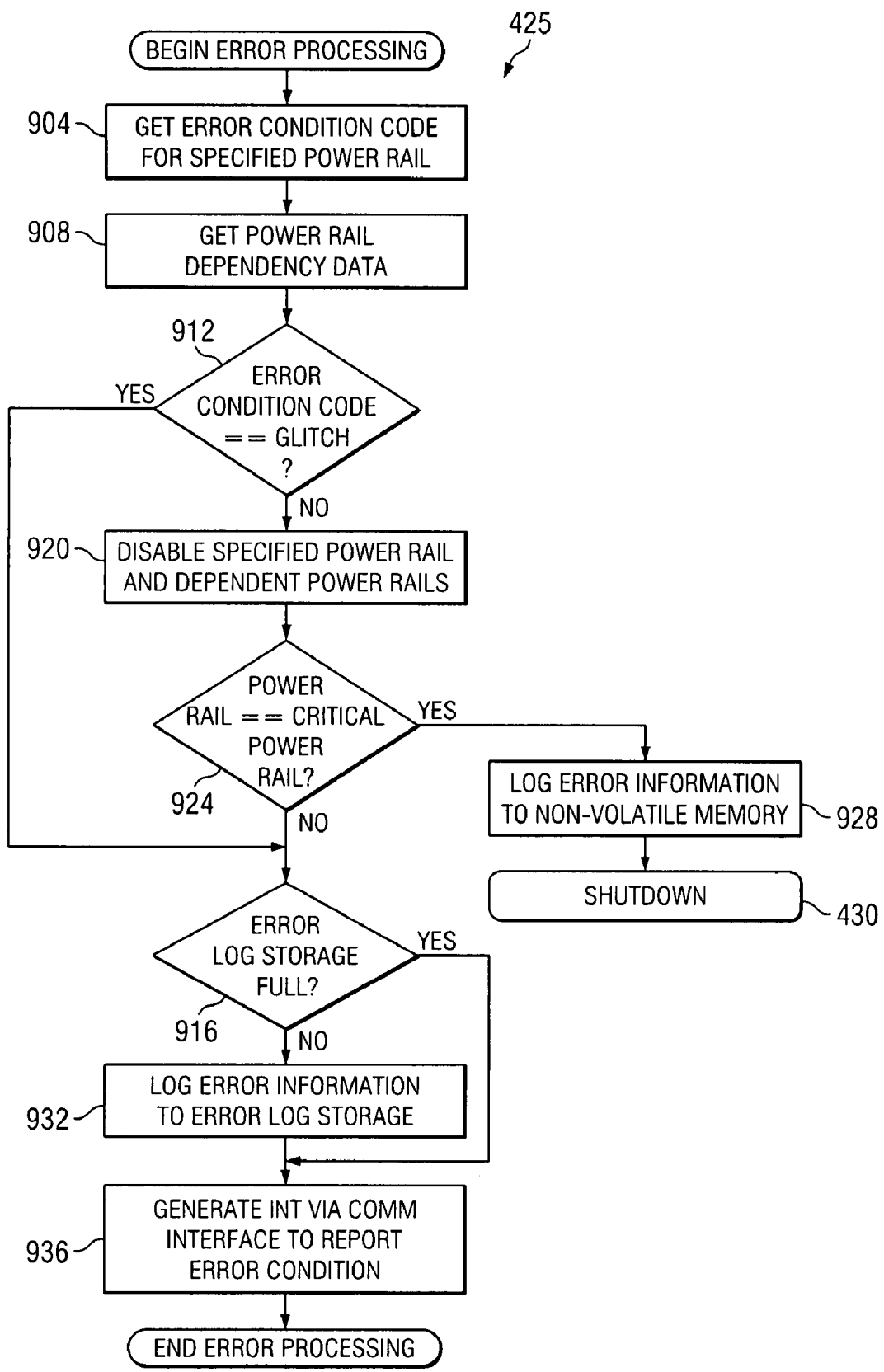
FIG. 9 is a flowchart representative of example machine readable instructions that may be executed to implement an example error processor which may be used to implement the example power monitor of FIG. 3.

If an error condition occurs during the execution of block 410, control proceeds to block 425 at which the example power monitor 110 performs error processing. For example, control may proceed from block 410 to block 425 when the example power monitor 110 is executing the supervision machine readable instructions 415 at block 410 and any or all of an over-voltage error condition, and under-voltage error condition and/or a glitch error condition occurs. Control may also proceed from block 410 to block 425 when the example power monitor 110 is executing the sequencing machine readable instructions 420 at block 410 and an enable failure error condition occurs. At block 425, the example power monitor 110 stores the received error condition in an error log. Additionally or alternatively, at block 425, the example power monitor 110 reports the error condition to, for example, an external device coupled to the power monitor 110 (e.g., such as a central controller, system backplane, etc.). Example machine readable instructions that may be executed to implement the processing at block 425 are illustrated in FIG. 9 and discussed in greater detail below.

If the error condition processed at block 425 is not a critical error condition (e.g., such as a glitch error condition), control returns to block 410 at which the example power monitor 110 continues performing supervision and/or sequencing as appropriate. If, however, the error condition processed at block 425 is a critical error condition (e.g., such as an under-voltage error condition, an over-voltage error condition, etc.), control proceeds as shown to block 430. At block 430, the example power monitor 110 enters a shutdown, or idle, state at which the example power monitor 110 shuts down one or more of the monitored power supplies coupled to the enable outputs 180A-180H. The example power monitor 110 then waits for a hardware reset, which forces control back to block 405, or a restart command received from an external device.

If a restart command, or any other information, is communicated to the example power monitor 110, an interrupt is triggered and control proceeds to block 435. For example, the interrupt may cause control to proceeds from block 410 to block 435, or from block 430 to block 435. At block 435, the example power monitor 110 receives the information from the external device via, for example, the communication port 210 (implementing, for example, an I2C serial interface). If the received information does not correspond to a restart command, the example power monitor 110 processes the received information and control then returns to the appropriate calling block (e.g., block 410 or block 430 as shown). If, however, the received information corresponds to a restart command, control proceeds to block 405 and blocks subsequent thereto at which the example power monitor 110 starts-up, performs the initialization procedure and then performs supervision and sequencing as discussed above.

Figure 5A:
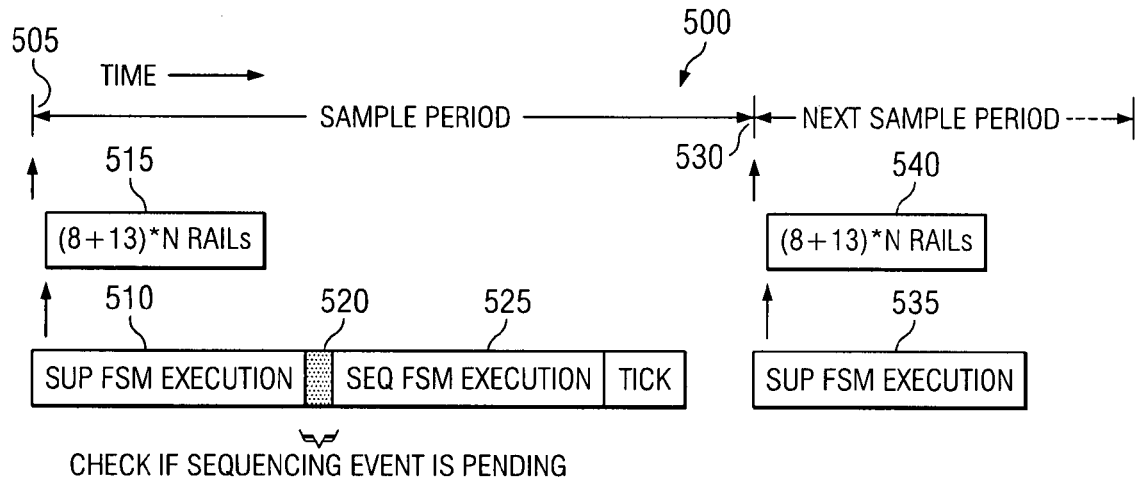
FIGS. 5A-5B collectively illustrate example processing timelines for two example processing scenarios executed by the example machine readable instructions of FIG. 4.
Figure 5B:
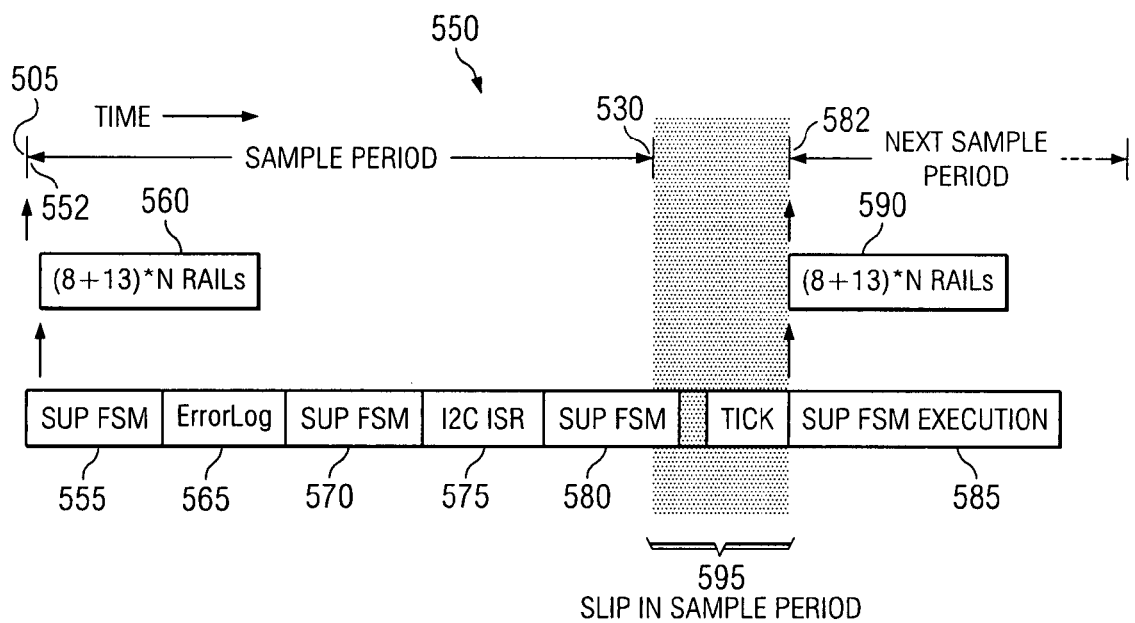

As illustrated in FIG. 4, during typical steady-state operation, the example machine readable instructions 400 execute the supervision machine readable instructions 415 in the context of block 410, with occasional branches to block 425 for error processing and/or block 435 for communication port processing. While the power supplies coupled to the example power monitor 110 are being enabled, processing may also occasionally branch to the sequencing machine readable instructions 420. Thus, execution at block 410 of the supervision machine readable instructions 415 defines a general steady-state processing loop, illustrated as a transition 440, for the example power monitor 110. As illustrated in FIGS. 5A-5B discussed in greater detail below, the number of processing cycles consumed by execution of the supervision machine readable instructions 415 at block 410 determines the maximum sampling rate at the rail inputs 170A-170H of the example power monitor 110. In some example applications, rather than continuously looping back to block 410 after execution of block 410 completes, the example power monitor 110 may be placed in a sleep mode to reduce power consumption. A device timer or similar device may then be used to wake (e.g., periodically) the example power monitor 110 and allow control to loop back to block 410 to begin the next steady-state processing cycle.

To better illustrate the steady-state operation of the example power monitor 110 executing the example machine readable instructions 400, two example processing timelines are illustrated in FIGS. 5A and 5B, respectively. The example processing timeline 500 of FIG. 5A illustrates the typical steady-state operation of the example power monitor 110. At a start time 505 of the steady-state processing loop of block 410, the supervision machine readable instructions 415 begin execution and continue executing during the illustrated example time interval 510. In parallel, the example power monitor 110 initiates sampling and A/D conversion of the rail inputs 170A-170H (e.g., via the sample-and-hold unit 320, A/D converter 325 and multiplexer 330). The sampling and A/D conversion process occurs during an illustrated example time interval 515. In the illustrated example, for each rail input 170A-170H, the sampling and A/D conversion requires 8 cycles for sample-and-hold time and an additional 13 cycles for conversion time. Although not shown, a DMA or other memory controller may write resulting data samples from the A/D converter 320 to the system memory 350.

At the end of the time interval 510 for executing the supervision machine readable instructions 415, the example power monitor 110 checks, during an illustrated example time interval 520, whether a sequencing event corresponding to any of the enable outputs 180A-180H is pending. If a sequencing event is pending, as in the illustrated example, the processing loop of block 410 executes the sequencing machine readable instructions 420 during an illustrated example time interval 525. At the end of the time interval 525 for executing the sequencing machine readable instructions 420, the steady-state processing of block 410 halts. At some later time 530, for example, triggered by a device or system timer, the processing loop of block 410 is restarted and the supervision machine readable instructions 415 are executed during an illustrated example time interval 535. In parallel, the example power monitor 110 initiates sampling and A/D conversion of the rail inputs 170A-170H during an illustrated example time interval 540. The time interval between time 505 and time 530 defines the nominal input sampling rate supported by the example power monitor 110.

The example processing timeline 550 of FIG. 5B illustrates the effects of error processing at block 425 and communication port processing at block 435 on the typical steady-state operation of the example power monitor 110. In general, error processing at block 425 and/or communication port processing at block 435 may reduce the effective input sampling rate of the example power monitor 110. For reference, the example times 505 and 530 of FIG. 5A that define the nominal input sampling rate supported by the example power monitor 110 are shown in FIG. 5B. The example processing timeline 550 begins at time 552 with execution at block 410 of the supervision machine readable instructions 415 during an illustrated example time interval 555. In parallel, sampling and A/D conversion are performed during an illustrated example time interval 560. An error condition then causes execution at block 425 of error processing during an illustrated example time interval 565.

In the illustrated example, the error condition is not critical and control returns to block 410 to continue execution of the supervision machine readable instructions 415 during an illustrated example time interval 570. A communication interrupt then causes execution of communication port processing (block 435) during an illustrated example time interval 575. Control then returns to block 410 to continue execution of the supervision machine readable instructions 415 during an illustrated example time interval 580. At the end of the time interval 580 for executing the supervision machine readable instructions 415, the steady-state processing of block 410 halts.

At some later time 582, for example, triggered by a device or system timer, the processing loop of block 410 is restarted and the supervision machine readable instructions 415 are executed during an illustrated example time interval 585. In parallel, the example power monitor 110 initiates sampling and A/D conversion of the rail inputs 170A-170H during an illustrated example time interval 590. The time interval between time 552 and time 582 corresponds to the current input sampling rate of the example power monitor 110. As illustrated in FIG. 5B, the additional error processing at block 525 and/or communication port processing at block 535 may cause a timing slip 595 from the nominal sampling rate defined by the example times 505 and 530.

Example supervision machine readable instructions 415 that may be used to implement the processing at block 415 of FIG. 4 and/or the example supervisor 365 of FIG. 3 are illustrated in FIGS. 6A-6B. The example supervision machine readable instructions 415 begin execution at block 604 at which the example supervisor 365 perform an initialization procedure to initialize pointers for writing rail input data samples from the A/D converter 325 to the system memory 350 and for reading the data sample from the system memory 350 for supervision processing. In some implementations, the example power monitor 110 may employ a circular buffer scheme to store the rail input data samples. An example circular buffer scheme for use by the example power monitor 110 is illustrated in FIG. 7.

Figure 7:
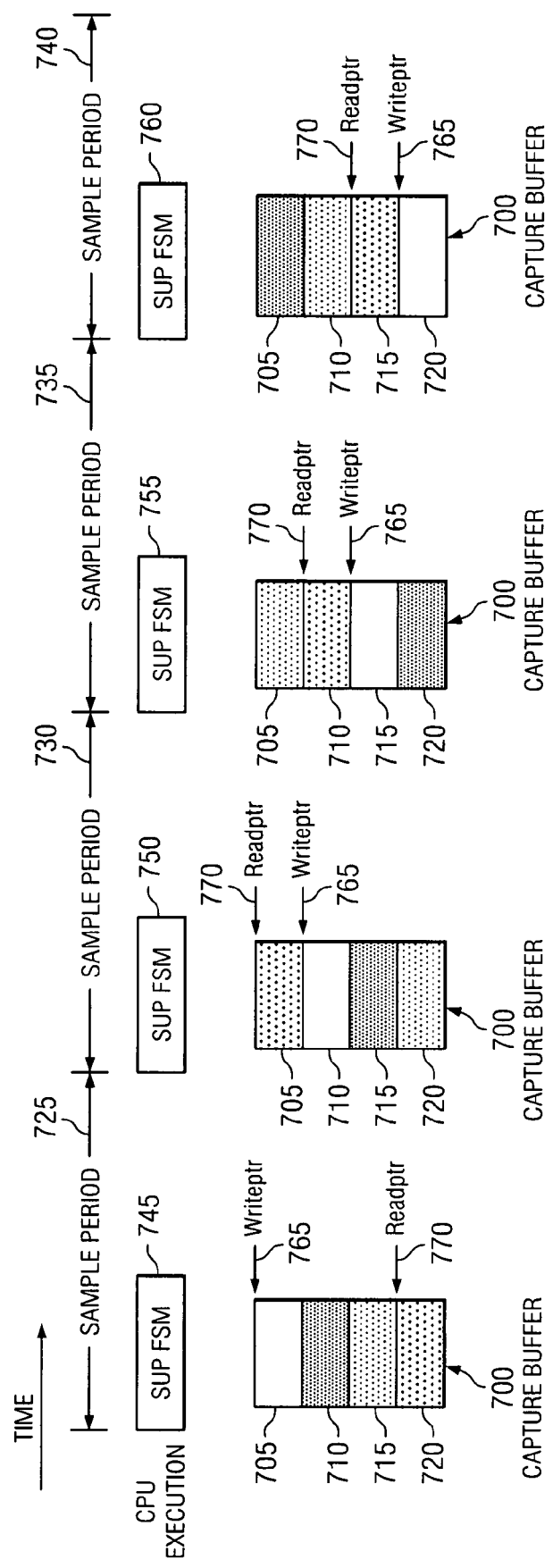
FIG. 7 illustrates an example circular buffer scheme which may be used to implement the example machine readable instructions of FIGS. 6A-6B.

In the example circular buffer scheme of FIG. 7, a circular buffer 700 having four storage buffers 705, 710, 715 and 720 is used to store rail input data samples obtained by sampling the rail inputs 170A-170H. FIG. 7 further illustrates four sampling intervals 725, 730, 735 and 740 corresponding, respectively, to four processing iterations 745, 750, 755 and 760 of the supervision machine readable instructions 415. For the first processing iteration 745 during the first sampling interval 725, a write pointer 765 for writing rail input data samples from the A/D converter 325 to the circular buffer 700 points to the first, or next, buffer 705. A read pointer 770 for reading rail input data samples from the circular buffer 700 for supervision processing points to the fourth, or current, buffer 725. Thus, new rail input data samples may be written into the first buffer 705 of the circular buffer while existing data sample may be read and processed out of the fourth buffer 725 of the circular buffer 700.

Similarly, for the second processing iteration 750 during the second sampling interval 730, the write pointer 765 for writing rail input data samples from the A/D converter 325 to the circular buffer 700 points to the second, or next, buffer 710. The read pointer 770 for reading rail input data samples from the circular buffer 700 for supervision processing points to the first, or current, buffer 705. For the third processing iteration 755 during the third sampling interval 735, the write pointer 765 for writing rail input data samples from the A/D converter 325 to the circular buffer 700 points to the third, or next, buffer 715. The read pointer 770 for reading rail input data samples from the circular buffer 700 for supervision processing points to the second, or current, buffer 710. Finally, for the fourth processing iteration 760 during the fourth sampling interval 740, the write pointer 765 for writing rail input data samples from the A/D converter 325 to the circular buffer 700 points to the fourth, or next, buffer 720. The read pointer 770 for reading rail input data samples from the circular buffer 700 for supervision processing points to the third, or current, circular buffer 715.

In each storage buffer 705, 710, 715 and 720, rail input data samples corresponding to the rail inputs 170A-170H (or, for example, any active subset thereof) are stored in a known order, such as, for example, a sequential order. During a particular processing iteration/sampling interval, the write pointer 765 is advanced through the appropriate next storage buffer (705, 710, 715 or 720) to store the rail input data samples corresponding to each of the rail inputs 170A-170H (or, for example, any active subset thereof) in the known order. Similarly, the read pointer 770 is advanced through the appropriate current storage buffer (705, 710, 715 or 720) for reading and processing the rail input data samples corresponding to each of the rail inputs 170A-170H (or, for example, any active subset thereof).

Returning to FIGS. 6A-6B, and in light of the example circular buffer scheme 700 of FIG. 7, at block 604 the circular buffer write pointer 765 and read pointer 770 are initialized for the current processing loop of the example supervision machine readable instructions 415. In particular, the write pointer 765 and the read pointer 770 are initialized to point, respectively, to the appropriate next and current storage buffers (e.g., respective ones of the buffers 705, 710, 715 and 720) corresponding to the current processing iteration as discussed above in connection with FIG. 7. Furthermore, the write pointer 765 and the read pointer 770 are initialized to point to the first rail input data sample storage location in the respective next and current storage buffers 705, 710, 715, 720 (e.g., such as the rail input data sample storage location corresponding to, for example, rail input 170A). Control then proceeds to block 608 at which the example power monitor 110 initiates sampling and A/D conversion of the rail inputs 170A-170H (e.g., via the sample-and-hold unit 320, the A/D converter 325 and the multiplexer 330). As discussed above in connection with FIGS. 5A-5B, sampling and A/D conversion of the rail inputs 170A-170H is performed by the example power monitor 110 in parallel with supervision and/or sequencing processing.

Next, control proceeds to block 612 at which the example supervisor 365 obtains the over-voltage and the under-voltage thresholds for the current rail input (e.g., such as rail input 170A) being processed. In some example implementations, different over-voltage and under-voltage thresholds are associated with each rail input 170A-170H. In other example implementations, the same over-voltage thresholds and/or under-voltage thresholds are associated with some or all of the rail inputs 170A-170H. Assuming without loss of generality that the current rail input is rail input 170A, control then proceeds to block 616 at which the example supervisor 365 determines a rolling average voltage for rail input 170A. For example, at block 616 the example supervisor 365 averages the rail input data samples corresponding to rail input 170A stored in all of the storage buffers 705, 710, 715 and 720 (or any specified subset thereof).

Next, at block 620 the example supervisor 365 determines whether the average voltage determined for rail input 170A is greater than the over-voltage threshold obtained at block 612. If the example supervisor 365 determines that the average voltage is greater than the over-voltage threshold (block 620), control proceeds to block 624 at which the example supervisor 365 clears an in-regulation indicator used to indicate whether the power rail corresponding to rail input 170A is in-regulation. By clearing the in-regulation indicator, the example supervisor 365 indicates that the power rail corresponding to rail input 170A is out-of-regulation due to the detected over-voltage condition. Control then proceeds to block 628 at which the example supervisor 365 sets an error condition to indicate that an over-voltage error condition has occurred with respect to rail input 170A. Control then proceeds to block 425 for error processing, which corresponds to the error processing block 425 of FIG. 4. Example machine readable instructions that may be used to implement the error processing performed at block 425 are illustrated in FIG. 9 and discussed in greater detail below.

Returning to block 620, if, however, the example supervisor 365 determines that the average voltage is not greater than the over-voltage threshold (block 620), control proceeds to block 632. At block 632, the example supervisor 365 determines whether the average voltage determined at block 616 for rail input 170A is greater than or equal to the under-voltage threshold obtained at block 612. If the example supervisor 365 determines that the average voltage is not greater than or equal to the under-voltage threshold (block 632), the average voltage must, therefore, be less than the under-voltage threshold and control proceeds to block 636. At block 636, the example supervisor 365 clears an in-regulation indicator used to indicate whether the power rail corresponding to rail input 170A is in-regulation. By clearing the in-regulation indicator, the example supervisor 365 indicates that the power rail corresponding to rail input 170A is out-of-regulation due to the detected under-voltage condition. Control then proceeds to block 640 at which the example supervisor 365 sets an error condition to indicate that an under-voltage error condition has occurred with respect to rail input 170A. Control then proceeds to block 425 for error processing, which corresponds to the error processing block 425 of FIG. 4. Example machine readable instructions that may be used to implement the error processing performed at block 425 are illustrated in FIG. 9 and discussed in greater detail below.

However, if the example supervisor 365 determines that the average voltage is greater than or equal to the under-voltage threshold (block 632), the average voltage must, therefore, lie between the under-voltage threshold and over-voltage threshold and control proceeds to block 644. At block 644, the example supervisor 365 sets an in-regulation indicator to indicate that the power rail corresponding to rail input 170A is in-regulation. Control then proceeds to block 648 at which the example supervisor 365 obtains the current rail input data sample corresponding to the rail input 170A. For example, the current rail input data sample corresponding to the rail input 170A is obtained from the rail input data sample storage location referenced by the circular buffer read pointer 770.

Next, control proceeds to block 652 at which the example supervisor 365 determines whether the current rail input data sample obtained at block 648 for rail input 170A is less than the under-voltage threshold obtained at block 612. If the current rail input data sample is not less than the under-voltage threshold (block 652), control proceeds to block 656 at which the example supervisor 365 determines whether the current rail input data sample for rail input 170A is greater than the over-voltage threshold obtained at block 612. If the current rail input data sample is not greater than the over-voltage threshold (block 656), supervision processing for rail input 170A is completed and control proceeds to block 660.

However, if the current rail input data sample is less than the under-voltage threshold (block 652) or greater than the over-voltage threshold (block 656), control proceeds to block 664. At block 664, the example supervisor 365 sets an error condition to indicate that a glitch error condition has occurred with respect to rail input 170A. Control then proceeds to block 425 for error processing, which corresponds to the error processing block 425 of FIG. 4. Example machine readable instructions that may be used to implement the error processing performed at block 425 are illustrated in FIG. 9 and discussed in greater detail below. After error processing at block 425 completes, control then proceeds to block 660.

At block 660, the example supervisor 365 determines whether supervision processing has been performed for all active rail inputs 170A-170H. If supervision processing has not been performed for all active rail inputs 170A-170H (block 660), control proceeds to block 664 at which the example supervisor 365 adjusts the circular buffer read pointer 770 to point to the next rail input data sample storage location in the current storage buffer. For example, and without loss of generality, if supervision processing for rail input 170A just completed, then at block 664 the example supervisor 365 would adjust the read pointer 770 to point to the rail input data sample storage location corresponding to rail input 170B (or, for example, the next active rail input 170A-170H). Control then returns to block 612 and blocks subsequent thereto at which the example supervisor 365 performs supervision processing for the next active rail input, such as, for example, rail input 170B.

If, however, supervision processing has been performed for all active rail inputs 170A-170H (block 660), control proceeds to block 668 at which the example supervisor 365 adjusts the circular buffer read pointer 770 to point to the next storage buffer in the circular buffer 700. Control the proceeds to block 672 at which the example power monitor 110 determines whether sequencing needs to be performed for any or all of the power supplies controlled by the enable outputs 180A-180H and monitored by the rail inputs 170A-170H. For example, at block 672 the example power monitor 110 may check an indicator (e.g., such as a bit value) associated with each enable output 180A-180H (or any active subset thereof) to determine whether a sequencing event is pending for the power rail associated with the indicator. If one or more sequencing events are pending and, thus, sequencing needs to be performed (block 672), control proceeds to block 420 at which the example power monitor 110 performs sequencing processing. Block 420 of FIGS. 6A-6B corresponds to the example sequencing machine readable instructions 420 executed at block 410 of FIG. 4. Example machine readable instructions that may be used to implement the sequencing processing performed at block 420 are illustrated in FIGS. 8A-8B and discussed in greater detail below. After sequencing processing at block 420 completes, or if no sequencing is required (block 672), execution of the example supervision machine readable instructions 415 then ends.

Example sequencing machine readable instructions 420 that may be used to implement the example sequencer 370 of FIG. 3 and/or the processing at block 420 of FIGS. 4 and/or 6A-6B are illustrated in FIGS. 8A-8B. The example sequencing machine readable instructions 420 may be executed by the example sequencer 370 when one or more sequencing events are pending for the power rails controlled by the enable outputs 180A-180H and monitored by the rail inputs 170A-170H. Various techniques may be used to determine whether one or more sequencing events are pending. In some example implementations, an indicator, such as, for example, a Boolean value, may be set to indicate a sequencing event is pending. Additionally or alternatively, in some example implementations a sequencing event table may be used to determine what type of sequencing event is specified for a particular power rail controlled by a particular enable output 180A-180H and whether a sequencing event is pending for the particular power rail. The sequencing event table may be stored, for example, in the system memory 350.

The example sequencing machine readable instructions 420 begin execution at block 804 at which the example sequencer 370 obtains sequencing information corresponding to a current one of the power rails being processed. For example, the example sequencer 370 may be configured to perform sequencing processing for the power rails controlled by the enable outputs 180A-180H in a particular order (e.g., such as a sequential order). The sequencing information obtained at block 804 by the example sequencer 370 includes, for example, an indication of whether the current rail is active, a sequencing event type associated with the current rail, parameters associated with the sequencing event type, etc. Example sequencing event types include: (1) an elapsed time event, (2) an after parent rail regulation event (i.e., a parent rail has entered an in-regulation state), (3) an after parent rail voltage event (i.e., a parent rail has reached a certain voltage level or threshold), etc. Parameters associated with a particular sequencing event type may include a sequencing time parameter, a parent rail identifier, a parent rail voltage threshold, etc.

Assuming without loss of generality that the example sequencer 370 is configured to begin sequencing processing with enable output 180A, at block 804 the example sequencer obtains the sequencing information, including sequencing event type and associated parameters, for the power rail corresponding to enable output 180A. Control then proceeds to block 808 at which the example sequencer 370 determines whether a sequencing event is already pending for the enable output 180A (i.e., the current enable output). If a sequencing event is not already pending (block 808), control proceeds to block 812 at which the example sequencer 370 determines which sequencing event type is associated with the enable output 180A based on the sequencing information obtained at block 804.

If the example sequencer 370 determines that the sequencing event type for enable output 180A is an elapsed time event (block 812), control proceeds to block 816 to process the sequencing after elapsed time event. To process a sequencing after elapsed time event, the example sequencer 370 waits for a specified sequencing time to elapse before asserting the enable output 180A, thereby allowing the corresponding power rail to be enabled. Thus, at block 816, the example sequencer 370 obtains the sequencing time parameter associated with the elapsed time sequencing event from the sequencing information obtained at block 804. Control then proceeds to block 820 at which the example sequencer 370 determines whether a system time maintained by the example power monitor 110 has reached or exceeded the sequencing time parameter.

If the system time has reached or exceeded the sequencing time parameter (block 820), control proceeds to block 824 at which the example sequencer 370 schedules the sequencing of the enable output 180A. In particular, at block 824 the example sequencer 370 sets an enable flag corresponding to the enable output 180A. Additionally, the example sequencer 370 sets a flag to indicate that a sequencing event is now pending for the enable output 180A. Furthermore, the example sequencer 370 determines an expected start time for the power rail controlled by the enable output 180A. For example, an expected ramp time for the current rail (e.g., the rail controlled by enable output 180A) may be included in the sequencing information obtained at block 804. The expected start time for the power rail controlled by the enable output 180A may then be determined by adding the expected ramp time to the current system time maintained by the example power monitor 110. Then, after the processing at block 824 completes, or if the system time has not reached or exceeded the sequencing time parameter (block 820), control proceeds to block 828.

Returning to block 812, if the example sequencer 370 determines that the sequencing event type for enable output 180A is an after parent rail voltage event (block 812), control proceeds to block 832 to process the sequencing after parent rail voltage event. To process a sequencing after parent rail voltage event, the example sequencer 370 waits for a specified parent power rail to reach a specified voltage before asserting the enable output 180A, thereby allowing the corresponding power rail to be enabled. Thus, at block 832 the example sequencer 370 obtains the parent rail identifier and parent rail voltage threshold associated with the after parent rail voltage sequencing event from the sequencing information obtained at block 804. Additionally, at block 832 the example sequencer 370 obtains regulation information corresponding to the specified parent rail. The regulation information may include, for example, the parent rail's current voltage. For example, the example sequencer 370 may obtain information concerning the parent rail's voltage from the system memory 350. The parent rail's voltage may be stored in the system memory by the example supervisor 365 or in response to action initiated by the example supervisor 365. For example, the parent rail's voltage obtained by the example sequencer 370 at block 832 may correspond to a rail input data sample stored in the circular buffer 700 in response to the example supervisor 365 initiating sampling and A/D conversion of the rail inputs 170A-170H. Alternatively, the parent rail's voltage obtained by the example sequencer 370 at block 832 may correspond to an average voltage determined by the example supervisor 365 for the particular rail input 170A-170H corresponding to the parent rail.

After obtaining the parent rail's voltage at block 832, control then proceeds to block 836 at which the example sequencer 370 determines whether the specified parent rail has reached or exceeded the specified parent rail voltage threshold. If the specified parent rail has reached or exceeded the specified parent rail voltage threshold (block 836), control proceeds to block 824 at which the example sequencer 370 schedules the sequencing of the enable output 180A (i.e., the current enable output). The processing performed at block 824 is discussed in greater detail above. After the processing at block 824 completes, or if the specified parent rail has not reached or exceeded the specified parent rail voltage threshold (block 836), control proceeds to block 828.

Returning to block 812, if the example sequencer 370 determines that the sequencing event type for enable output 180A is an after parent rail regulation event (block 812), control proceeds to block 840 to process the sequencing after parent rail regulation event. To process a sequencing after parent rail regulation event, the example sequencer 370 waits for a specified parent power rail to reach an in-regulation condition before asserting the enable output 180A, thereby allowing the corresponding power rail to be enabled. Additionally, the example sequencer 370 may wait for a specified time delay to elapse after the parent rail is in-regulation before asserting the enable output 180A. Thus, at block 840 the example sequencer 370 obtains the parent rail identifier and a sequencing delay parameter associated with the after parent rail regulation sequencing event from the sequencing information obtained at block 804. Additionally, at block 840 the example sequencer 370 obtains regulation information corresponding to the specified parent rail. The regulation information may include, for example, a regulation status indicator corresponding to the specified parent rail. For example, the example sequencer 370 may obtain information concerning the parent rail's regulation status from the system memory 350. The parent rail's regulation status may be stored in the system memory by the example supervisor 365. For example, the parent rail's regulation status obtained by the example sequencer 370 at block 832 may correspond to a regulation indicator associated with the parent rail. As discussed above in connection with the example supervision machine readable instructions 415 of FIGS. 6A-6B, the regulation indicator may be set when the parent rail is in-regulation and cleared when the parent rail is out-of-regulation.

After obtaining the parent rail's regulation information at block 840, control then proceeds to block 844 at which the example sequencer 370 determines whether the specified parent rail is in-regulation. If the specified parent rail is in-regulation (block 844), control proceeds to block 848 at which the example sequencer 370 obtains the sequencing delay parameter for the sequencing after parent rail event. Control then proceeds to block 852 at which the example sequencer 370 determines whether the sequencing delay for the sequencing after parent rail event is equal to zero. If the sequencing delay is zero (block 852), control proceeds to block 824 at which the example sequencer 370 schedules the sequencing of the enable output 180A (i.e., the current enable output). The processing performed at block 824 is discussed in greater detail above. After the processing at block 824 completes, or if the specified parent rail is not in-regulation (block 844), control proceeds to block 828. However, if the sequencing delay is not zero (block 852), control proceeds to block 856 at which the delay is decremented. Control then proceeds to block 828.

At block 828, the example sequencer 370 determines whether the expected start time for the current power rail being sequenced via enable output 180A (i.e., the current enable output) exceeds the system time maintained by the example power monitor 110. If the expected start time does not exceed the system time (block 828), the current power rail being sequenced via enable output 180A is not yet expected to be enabled and, thus, control proceeds to block 860. However, if the expected start time does exceed the system time (block 828), the current power rail being sequenced via enable output 180A is expected to be enabled and, thus, control proceeds to block 864.

At block 864, the example sequencer 370 obtains regulation information corresponding to the current power rail being sequenced. The regulation information may include, for example, a regulation status indicator corresponding to the current power rail. The regulation status indicator may be stored, for example, in system memory 350 and updated, for example, by the example supervisor 365.

Next, control proceeds to block 868 at which the example sequencer 370 determines whether the current power rail being sequenced is in-regulation. If the current power rail being sequenced is not in-regulation (block 868), control proceeds to block 872 at which the example sequencer 370 sets an error condition to indicate that an enable failure error condition has occurred with respect to the current power rail being sequenced via the enable output 180A. Control then proceeds to block 425 for error processing, which corresponds to the error processing block 425 of FIG. 4. Example machine readable instructions that may be used to implement the error processing performed at block 425 are illustrated in FIG. 9 and discussed in greater detail below. After error processing at block 425 completes, or if the current power rail being sequenced is in-regulation (block 868), control then proceeds to block 860.

At block 860, the example sequencer 370 determines whether sequencing processing has been performed for all active power rails controlled via the active enable outputs 180A-180H. If sequencing processing has not been performed for all active enable outputs 180A-180H (block 860), control proceeds to block 876 at which the example sequencer 370 is configured to perform sequencing processing for the next enable output in the set of active enable outputs 180A-180H. For example, and without loss of generality, if sequencing processing for enable output 180A just completed, then at block 876 the example sequencer 370 would be configured to perform sequencing processing for enable output 180B (or, for example, the next active enable output 180A-180H). Control then returns to block 804 and blocks subsequent thereto at which the example sequencer 370 performs supervision processing for the next active enable output, such as, for example, enable output 180B.

If, however, sequencing processing has been performed for all active power rails controlled via the active enable outputs 180A-180H (block 860), control proceeds to block 880 at which the example sequencer 370 asserts those enable outputs 180A-180H having enable flags that were set at block 824. Execution of the example sequencing machine readable instructions 420 then ends.

Example error processing machine readable instructions 425 that may be used to implement the example error processor 375 of FIG. 3 and/or the processing at block 425 of FIGS. 4, 6A-6B and/or 8A-8B are illustrated in FIG. 9. The example error processing machine readable instructions 425 may be executed in response to the occurrence of an error condition and begin execution at block 904. At block 904, the example error processor 375 obtains an error condition code describing the error condition which caused the example error processing machine readable instructions 425 to be invoked. Error condition codes may be generated by the example supervisor 365, the example sequencer 370 and/or any other component, process, etc., included in the example power monitor 110. Example error condition codes that may be generated by the example supervisor 365 include, but are not limited to, codes representative of over-voltage error conditions, under-voltage error conditions, glitch conditions, etc. Example error condition codes that may be generated by the example sequencer 370 include, but are not limited to, codes representative of rail enable failure error conditions, etc.

In addition to obtaining the current error condition code, at block 904 the example error processor 375 also obtains an identifier specifying the power rail corresponding to the current error condition code. Then, control proceeds to block 908 at which the example error processor 375 obtains any power rail dependency data associated with the power rail corresponding to the current error condition code. The power rail dependency data obtained at block 908 identifies any other power rails that are dependent on the power rail corresponding to the current error code. Next, control proceeds to block 912 at which the example error processor 375 determines whether the error condition code obtained at block 904 corresponds to a glitch error condition. In the illustrated example, a glitch error condition is a non-critical error condition. As such, if the example error processor 375 determines that the error condition code corresponds to a glitch error condition (block 912), control proceeds to block 916 for error logging processing and no power rails are disabled in response to the current error condition code.

However, if the example error processor 375 determines that the current error condition code does not corresponds to a glitch error condition (block 912), control proceeds to block 920. In the illustrated example, all error conditions except for the glitch error condition are considered critical error conditions. As such, at block 920 the example error processor 375 disables the power rail corresponding to the current error condition code obtained at block 904. Additionally, the example error processor 375 disables any power rails that are dependent on the power rail corresponding to the current error condition code. The dependent power rails to be disabled are identified based on the power rail dependency data obtained at block 908. At block 920, the example error processor 375 disables the power rail corresponding to the current error condition code, as well as any dependent power rails, by controlling the appropriate enable outputs 180A-180H. For example, the example error processor 375 may be configured to clear the particular enable outputs 180A-180H controlling the power rail corresponding to the current error condition code and any dependent power rails to disable these rails.

After disabling the specified power rails at block 920, control proceeds to block 924 at which the example error processor 375 determines whether any of the power rails disabled at block 920 are critical power rails. In the illustrated example, critical power rails are defined to be power rails required for system operation. As such, if a critical error condition occurs with respect to a critical power rail, the example power monitor 110 prepares to commence a system shutdown and disable all power rails being monitored. Thus, if the example error processor 375 determines that any of the power rails disabled at block 920 correspond to critical power rails (block 924), control proceeds to block 928 at which the example error processor 375 logs any error information corresponding to the current error condition. At block 928, the error information is logged to the non-volatile memory 380 to allow the error information to be retrieved at some time subsequent to the system shutdown.

Next, control proceeds to block 430 at which the example power monitor 110 enters a shutdown, or idle, state at which the example power monitor 110 disables the monitored power supplies coupled to the enable outputs 180A-180H. Block 430 of FIG. 9 corresponds to the shutdown state 430 of FIG. 4. The processing performed at block 430 is, therefore, discussed in greater detail above in connection with the operation of the shutdown state 430 of FIG. 4. If, however, the example error processor 375 determines that none of the power rails disabled at block 920 correspond to critical power rails (block 924), control proceeds to block 916.

At block 916, the example error processor 375 determines whether an error log used to store error information corresponding to non-critical power rails is full. The error log examined at block 916 may be stored, for example, in the system memory 350. If the error log is not full (block 916), control proceeds to block 932 at which the example error processor 375 stores error information corresponding to the current error code in the error log. Execution of the example error processing machine readable instructions 430 then proceeds to block 936. However, if the error log is full (block 916), control proceeds to block 936. At block 936, the example error processor 375 causes an interrupt signal to be generated at the interrupt output 220. A receiving device (e.g., such as a central controller, backplane, etc.) coupled to the interrupt output 220 may then receive the error log information corresponding to the current error code via, for example, the communication port 210. After processing at block 936 completes, execution of the example error processing machine readable instructions 430 then ends.

Figure 10:
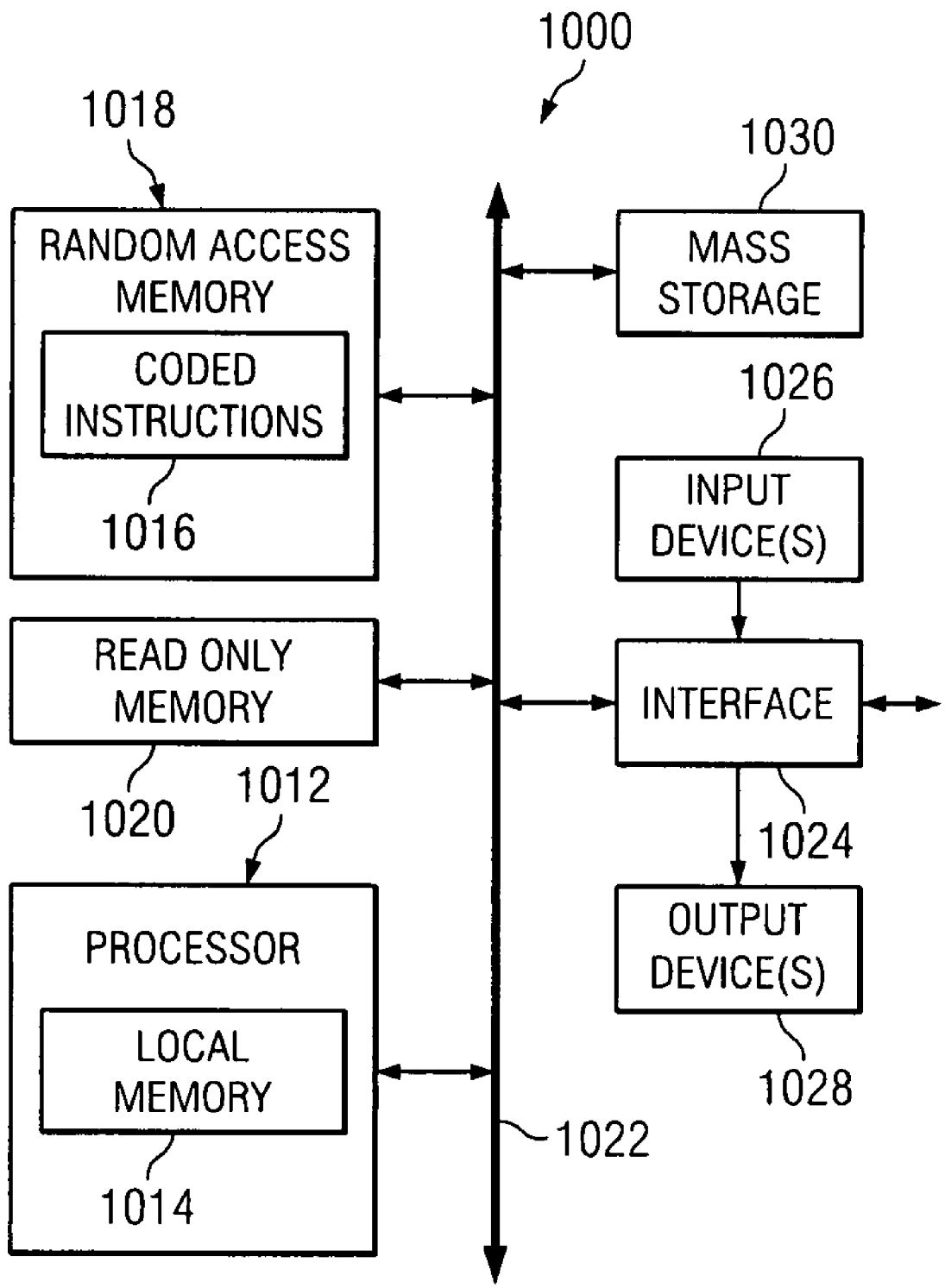
FIG. 10 is a block diagram of an example computer that may execute the example machine readable instructions of FIGS. 4, 6A-6B, 8A-8B and/or 9 to implement the example power monitor of FIG. 3.

FIG. 10 is a block diagram of an example computer 1000 capable of implementing the apparatus and methods disclosed herein. The computer 1000 can be, for example, a server, a personal computer, a personal digital assistant (PDA), an Internet appliance, a DVD player, a CD player, a digital video recorder, a personal video recorder, a set top box, or any other type of computing device.

The system 1000 of the instant example includes a processor 1012 such as a general purpose programmable processor. The processor 1012 includes a local memory 1014, and executes coded instructions 1016 present in the local memory 1014 and/or in another memory device. The processor 1012 may execute, among other things, the machine readable instructions represented in FIGS. 6A-6B, 8A-8B and/or 9. The processor 1012 may be implemented by any type of processing unit, such as, but not limited to, one or more microcontrollers, microprocessors, field programmable gate-arrays (FPGAs), μ-coded machines, etc.

The processor 1012 is in communication with a main memory including a volatile memory 1018 and a non-volatile memory 1020 via a bus 1022. The volatile memory 1018 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1020 may be implemented by flash memory and/or any other desired type of memory device. Access to the main memory 1018, 1020 is typically controlled by a memory controller (not shown).

The computer 1000 also includes an interface circuit 1024. The interface circuit 1024 may be implemented by any type of interface standard, such as an Ethernet interface, a universal serial bus (USB), and/or a third generation input/output (3GIO) interface.

One or more input devices 1026 are connected to the interface circuit 1024. The input device(s) 1026 permit a user to enter data and commands into the processor 1012. The input device(s) can be implemented by, for example, a keyboard, a mouse, a touchscreen, a track-pad, a trackball, an isopoint and/or a voice recognition system.

One or more output devices 1028 are also connected to the interface circuit 1024. The output devices 1028 can be implemented, for example, by display devices (e.g., a liquid crystal display, a cathode ray tube display (CRT)), by a printer and/or by speakers. The interface circuit 1024, thus, typically includes a graphics driver card.

The interface circuit 1024 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The computer 1000 also includes one or more mass storage devices 1030 for storing software and data. Examples of such mass storage devices 1030 include floppy disk drives, hard drive disks, compact disk drives and digital versatile disk (DVD) drives. The mass storage device 1030 may implement the system memory 350. Alternatively, the volatile memory 1018 may implement the system memory 350.

As an alternative to implementing the methods and/or apparatus described herein in a system such as the device of FIG. 10, the methods and or apparatus described herein may be embedded in a structure such as a processor and/or an ASIC (application specific integrated circuit).

Finally, although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method comprising:
    supervising a first power rail from a first power supply driven from a common power supply and a second power rail from a second power supply driven from the common power supply by generating digital regulation information relating to first and second power rails;
    sequencing a first enable signal associated with the first power rail to the first power supply and a second enable signal associated with the second power rail to the second power supply; and
    determining whether the first power rail is enabled based on digital regulation information determined while supervising the first power rail compared to a condition specified in the sequencing.

2. A method as defined in claim 1 wherein supervising the first power rail comprises executing a supervision state machine to determine whether the first power rail is in-regulation.

3. A method as defined in claim 1 wherein supervising the first power rail comprises averaging a plurality of voltage samples from the first power rail to determine an average voltage associated with the first power rail.

4. A method as defined in claim 3 further comprising performing an analog-to-digital conversion to determine a new voltage sample for the first power rail, wherein the analog-to-digital conversion occurs substantially in parallel with averaging the plurality of voltage samples.

5. A method as defined in claim 3 further comprising Comparing the average voltage to a threshold to determine whether at least one of an over-voltage or an under-voltage condition has occurred.

6. A method as defined in claim 1 wherein supervising the first power rail comprises determining whether a voltage sample associated with the first power rail corresponds to a glitch condition.

7. A method as defined in claim 1 further comprising performing error processing when the first power rail is determined to be out-of-regulation.

8. A method as defined in claim 7 wherein performing error processing comprises:
    logging error information indicating whether the first power rail is associated with at least one of an over-voltage condition, an under-voltage condition or a glitch condition; and
    disabling the first power rail in response to at least one of the over-voltage condition or the under-voltage condition.

9. A method as defined in claim 1 wherein sequencing the first and second enable signals further comprises determining when to assert the second enable signal based on at least one of: (1) an elapsed time, (2) whether the first power rail is in-regulation, or (3) whether the first power rail has reached a particular voltage.

10. A method as defined in claim 1 wherein determining whether the first power rail is enabled comprises determining whether the first power rail is in-regulation within a particular elapsed time after asserting the enable signal.

11. A computer-readable memory storing machine readable instructions which, when executed, cause power monitor circuitry to:
    monitor a first power rail from a first power supply driven from a common power supply and a second power rail from a second power supply driven from the common power supply by generating digital regulation information relating to first and second power rails;
    sequence a first enable signal associated with the first power rail to the first power supply and a second enable signal associated with the second power rail to the second power supply; and
    determine whether the first power rail is enabled based on digital regulation information determined while monitoring the first power rail compared to a condition specified in the sequencing.

* * * * *